United States Patent
Kline

(10) Patent No.: US 8,058,569 B2
(45) Date of Patent: Nov. 15, 2011

(54) GASKETS FOR PROVIDING ENVIRONMENTAL SEALING AND/OR ELECTROMAGNETIC INTERFERENCE (EMI) SHIELDING

(75) Inventor: James E. Kline, Blairstown, NJ (US)

(73) Assignee: Laird Technologies, Inc., Chesterfield, MO (US)

( * ) Notice: Subject to any disclaimer, the term of this patent is extended or adjusted under 35 U.S.C. 154(b) by 363 days.

(21) Appl. No.: 12/367,745

(22) Filed: Feb. 9, 2009

(65) Prior Publication Data

US 2009/0140499 A1 Jun. 4, 2009

Related U.S. Application Data

(63) Continuation-in-part of application No. 11/526,275, filed on Sep. 22, 2006, now Pat. No. 7,488,900.

(51) Int. Cl.
*H05K 9/00* (2006.01)
(52) U.S. Cl. ......... 174/355; 174/367; 174/369; 277/920
(58) Field of Classification Search .................. 174/355, 174/356, 367, 368, 369; 361/816; 277/920
See application file for complete search history.

(56) References Cited

U.S. PATENT DOCUMENTS

| | | |
|---|---|---|
| 2,736,076 A | 2/1956 | Bush et al. |
| 2,942,308 A | 6/1960 | Naeser et al. |
| 2,954,592 A | 10/1960 | Parsons |
| 4,857,668 A | 8/1989 | Buonanno |
| 4,884,368 A | 12/1989 | Thornley et al. |
| 5,045,635 A * | 9/1991 | Kaplo et al. ............ 174/354 |
| 5,120,087 A | 6/1992 | Pastva |
| 5,532,426 A | 7/1996 | Blum et al. |
| 6,075,205 A | 6/2000 | Zhang |
| 6,235,986 B1 | 5/2001 | Reis et al. |
| 6,505,839 B1 | 1/2003 | Nishimuro et al. |
| 6,621,000 B2 | 9/2003 | Jensen et al. |
| 6,858,794 B2 | 2/2005 | Jensen et al. |
| 7,340,862 B2 | 3/2008 | Baratin et al. |
| 2002/0050692 A1 | 5/2002 | Nishimuro et al. |
| 2003/0037943 A1 | 2/2003 | Jensen et al. |
| 2003/0201111 A1 | 10/2003 | Jensen et al. |
| 2003/0209355 A1 | 11/2003 | Jensen et al. |
| 2004/0261322 A1 | 12/2004 | Baratin et al. |

FOREIGN PATENT DOCUMENTS

| | | |
|---|---|---|
| EP | 0998177 | 5/2000 |
| GB | 835484 | 5/1960 |
| GB | 852214 | 10/1960 |
| JP | 2000-307257 | 11/2000 |
| JP | 2001-007583 | 1/2001 |

(Continued)

OTHER PUBLICATIONS

Chomerics, EMI Shielding for Commercial Electronics, published Dec. 1997, 124 pages, see p. 25.

(Continued)

*Primary Examiner* — Hung Ngo
(74) *Attorney, Agent, or Firm* — Harness, Dickey & Pierce, P.L.C.

(57) ABSTRACT

A gasket generally includes upper and lower members and first and second oppositely-disposed lateral members. The first and second oppositely-disposed lateral members connect the lower member to the upper member such that a spaced distance separates the lower member's inner surface from the upper member's inner surface. The first and second lateral members, lower member, and lower member may collectively define a generally trapezoidal profile.

21 Claims, 34 Drawing Sheets

FOREIGN PATENT DOCUMENTS

WO  WO 2005/004573  1/2005

OTHER PUBLICATIONS

Chomerics, EMI Shielding Engineering Handbook, published Nov. 2000, 225 pages.

Chomerics, Extruded EMI Gaskets Products & Custom Solutions Catalog, published Sep. 2008, 84 pages, see pp. 31, 33, 34, and 35.

Laird Technologies catalog titled Elastomeric EMI Shielding Solutions, accessed and printed on Sep. 22, 2006 from http://www.lairdtech.com/downloads/ECECatalog.pdf; 56 pages.

Vanguard products corporation, Ultra-Vanshield®, RFI/EMI dual elastomer shielding gaskets, catalogue copyright notice 2002, 20 pages, see pp. 1, 5-11, and 14.

First Office Action from the Taiwan Intellectual Property Office dated Jul. 12, 2010 for Taiwanese Patent Application No. 96129346 (9 pages).

First Office Action from the Chinese Intellectual Property Office dated Sep. 2, 2010 for Chinese Patent Application No. 200780034949.1 (12 pages).

* cited by examiner

GASKETS FOR PROVIDING ENVIRONMENTAL SEALING AND/OR ELECTROMAGNETIC INTERFERENCE (EMI) SHIELDING

CROSS-REFERENCE TO RELATED APPLICATION

This application is a continuation-in-part of U.S. patent application Ser. No. 11/526,275 filed Sep. 22, 2006. which issued Feb. 10, 2009 as U.S. Pat. No. 7,488,900. The entire disclosure the above application is incorporated herein by reference in their entirety.

FIELD

The present disclosure generally relates to gaskets for providing environmental sealing and/or electromagnetic interference (EMI) shielding.

BACKGROUND

The statements in this section merely provide background information related to the present disclosure and may not constitute prior art.

Electrically-conductive elastomer seals and gasket products sometimes are configured to provide electromagnetic interference (EMI) shielding and provide environmental sealing. For example, a seal or gasket may be required to keep out contaminates, such as dust and moisture. Other times, a seal or gasket may be required to hold back a pressure differential, as in the case of a submersible camera.

Gaskets and seals have also been developed for use in gaps and around doors to provide a degree of EMI shielding while permitting operation of enclosure doors and access panels and fitting of connectors. To shield EMI effectively, the gasket should be capable of absorbing or reflecting EMI as well as establishing a continuous electrically conductive path across the gap in which the gasket is disposed. These gaskets can also be used for maintaining electrical continuity across a structure and for excluding from the interior of the device such contaminates as moisture and dust. Once installed, the gaskets essentially close or seal any interface gaps and establish a continuous electrically-conductive path thereacross by conforming under an applied pressure to irregularities between the surfaces. Accordingly, gaskets and seals intended for EMI shielding applications are specified to be of a construction that not only provides electrical surface conductivity even while under compression, but which also has a resiliency allowing the seals to conform to the size of the gap.

As used herein, the term "EMI" should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

SUMMARY

According to various aspects, exemplary embodiments are provided of gaskets. In one exemplary embodiment, a gasket generally includes a lower member having an inner surface and an outer surface, and an upper member having an inner surface and an outer surface. The gasket also includes first and second oppositely-disposed lateral members connecting the lower member to the upper member such that a spaced distance separates the lower member's inner surface from the upper member's inner surface. The first and second lateral members have a generally convex curvature and bowing inwardly relative to each other as the first and second lateral members extend from the lower member to the upper member. The first and second lateral members, lower member, and lower member collectively define a generally trapezoidal profile.

Another exemplary embodiment includes a gasket that generally includes upper and lower members. The lower member includes an inner surface and an outer surface that is substantially flat. The upper member includes an inner surface and an outer surface that is substantially flat and generally parallel with the lower member's outer surface. The gasket also includes first and second oppositely-disposed lateral members connecting the lower member to the upper member. The first and second lateral members, lower member, and lower member collectively define a generally trapezoidal profile with four generally rounded corner portions at about the intersections of the first and second lateral members with the lower member and upper member.

A further exemplary embodiment includes a gasket for interposition between first and second surfaces. The gasket includes a resilient, tubular body of indefinite length. The tubular body has generally continuous interior and exterior surfaces defining a wall thickness therebetween. The gasket also includes a lower member having an inner surface forming a first portion of the interior surface of the body and an outer surface forming a first portion of the exterior surface of the body for contact with the second surface. The gasket additionally includes an upper member narrower in width than the lower member. The upper member has an inner surface forming a second portion of the interior surface of the body, and an outer surface forming a second portion of the exterior surface of the body for contact with the first surface. The gasket further includes first and second oppositely-disposed lateral members connecting the lower member to the upper member such that a spaced distance separates the lower member's inner surface from the upper member's inner surface and such that the lower member's outer surface conforms to the second surface, with the upper member's outer surface generally parallel to the first surface. The first and second lateral members extend from corresponding edge portions of the upper member to intersect corresponding edge portions of the lower member such that the first and second lateral members, lower member, and upper member collectively define a generally trapezoidal profile having four generally rounded corner portions at about the intersections of the first and second lateral members with the lower member and upper member. The first and second lateral members have a generally convex curvature and bow inwardly relative to each other as the first and second lateral members extend from the upper member to intersect the lower member. The first lateral member has an outer surface forming a third portion of the exterior surface of the body, and an inner surface forming a third portion of the interior surface of the body and defining a first angle with the inner surface of the lower member and a second angle with the inner surface of the upper member. The second lateral member has an outer surface forming a fourth portion of the exterior surface of the body, and an inner surface forming a fourth portion of the interior surface of the body and defining a third angle with the inner surface of the lower member and a fourth angle with the inner surface of the upper member. The gasket also includes a portion extending generally downwardly from the lower member and configured to be engagingly received within a slot defined by one of the first and second surfaces, to thereby help mount the gasket to said one of the first and second surfaces.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
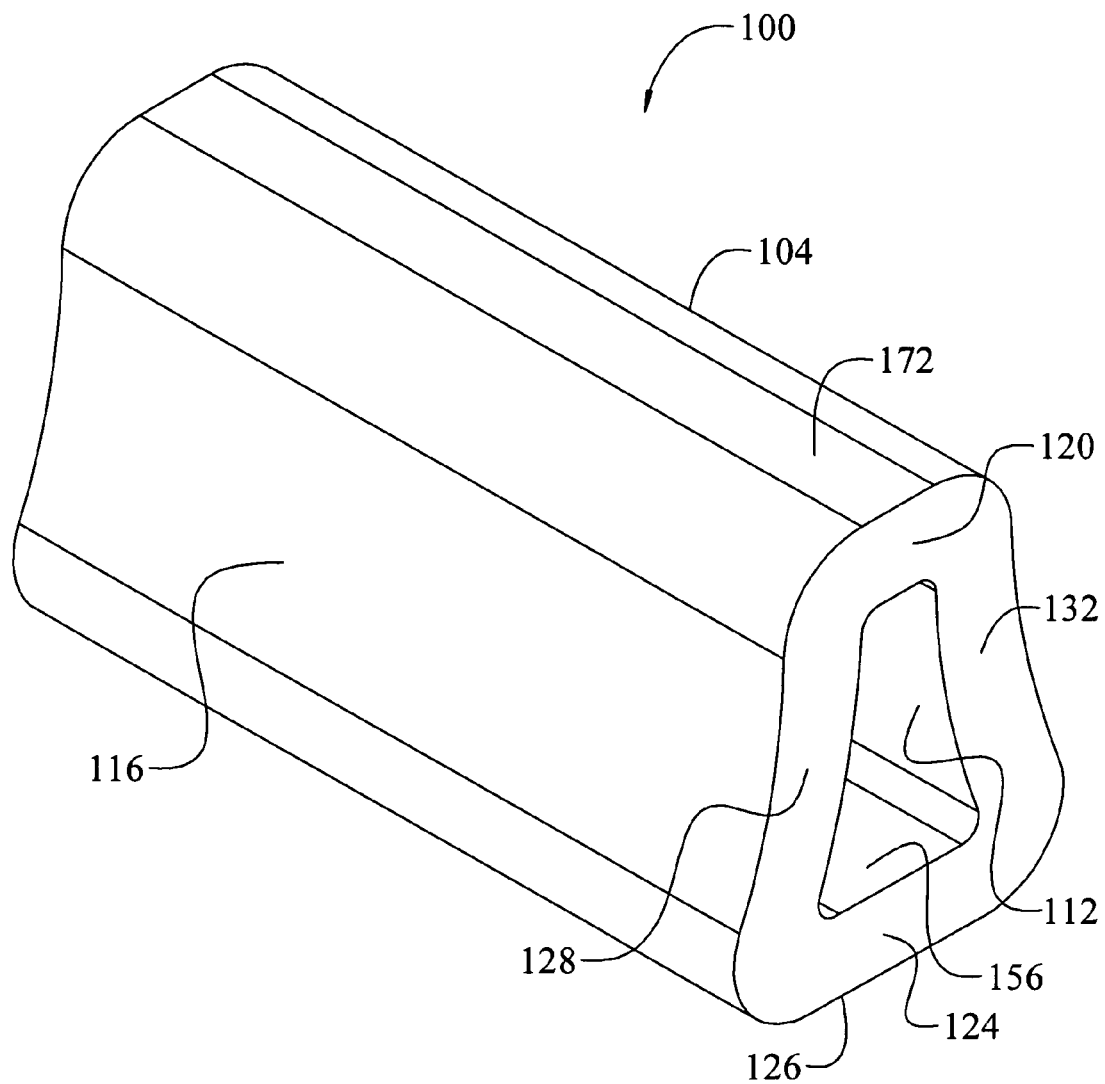
FIG. 1 is a perspective end view of an EMI shielding and/or environmental sealing gasket according to exemplary embodiments.

The following description is merely exemplary in nature and is in no way intended to limit the present disclosure, application, or uses. It should be understood that throughout the drawings, corresponding reference numerals indicate like or corresponding parts and features.

According to various aspects, exemplary embodiments are provided of gaskets. In one exemplary embodiment, the gasket generally includes a base member having an inner surface and an outer surface, and a top member having an inner surface and an outer surface. The gasket also has first and second oppositely-disposed lateral members curving generally inwardly relative to each other and connecting the base member to the top member such that a spaced distance separates the base member's inner surface from the top member's inner surface. The first and second lateral members, base member, and top member collectively define a generally trapezoidal profile with four generally rounded corner portions at about the intersections of the first and second lateral members with the base member and top member.

Another exemplary embodiment includes a gasket that is deflectable into a collapsed orientation between first and second surfaces. The gasket generally includes a resilient, electrically-conductive tubular body of indefinite length. The tubular body has a generally continuous interior and exterior surface defining a wall thickness therebetween. The gasket also includes a base member, a top member, and first and second lateral members. The top member has a narrower width than the base member. The first and second lateral members curve slightly inwardly relative to each other and connect the base member to the top member such that the gasket has a generally trapezoidal profile collectively defined by the first and second lateral members, base member, and top member. In this particular embodiment, the gasket is configured to seal against EMI and an air pressure differential of at least about 6.4 pounds per square inch when the base member is secured with adhesive to the second surface and the first surface is engaging the top member and compressing the gasket to a gap between about 0.295 inch to about 0.185 inch. This particular gasket embodiment is also configured to seal against EMI and an air pressure differential of at least about 8.6 pounds per square inch without exceeding a gasket force of about thirty-two pounds per inch of gasket length when the base member is secured with adhesive to the second surface and the first surface is engaging the top member and compressing the gasket to a gap between about 0.185 inch to about 0.134 inch.

A further exemplary embodiment includes a gasket for interposition between first and second surfaces. The gasket includes a resilient, tubular body of indefinite length. The tubular body has generally continuous interior and exterior surfaces defining a wall thickness therebetween. The gasket also includes a base member having an inner surface forming a first portion of the interior surface of the body and an outer surface forming a first portion of the exterior surface of the body for contact with the second surface. The gasket additionally includes a top member narrower in width than the base member. The top member has an inner surface forming a second portion of the interior surface of the body, and an outer surface forming a second portion of the exterior surface of the body for contact with the first surface. The gasket further includes first and second oppositely-disposed lateral members connecting the base member to the top member such that a spaced distance separates the base member's inner surface from the top member's inner surface and such that the base member's outer surface conforms to the second surface, with the top member's outer surface generally parallel to the first surface. The first and second lateral members extend from corresponding edge portions of the top member to intersect corresponding edge portions of the base member such that the first and second lateral members, base member, and top member collectively define a generally trapezoidal profile having four generally rounded corner portions at about the intersections of the first and second lateral members with the base member and top member. The first and second lateral members have a generally convex curvature and bow inwardly relative to each other as the first and second lateral members extend from the top member to intersect the base member. The first lateral member has an outer surface forming a third portion of the exterior surface of the body, and an inner surface forming a third portion of the interior surface of the body and defining a first angle with the inner surface of the base member and a second angle with the inner surface of the top member. The second lateral member has an outer surface forming a fourth portion of the exterior surface of the body, and an inner surface forming a fourth portion of the interior surface of the body and defining a third angle with the inner surface of the base member and a fourth angle with the inner surface of the top member.

Accordingly, various embodiments of gaskets are disclosed that are capable of providing electromagnetic interference (EMI) shielding, environmental sealing, and/or holding back a pressure differential. Advantageously, some embodiments provide gaskets having the ability to provide a minimum force (or at least relatively low force) necessary for electrical contact and the desired form(s) of environmental sealing across a range of compression, including a relatively small percentage compression to a relatively large percentage compression, while not exceeding a maximum allowable gasket force at the large percentage compression. Some of these embodiments (and/or alternative embodiments) may also be useful for sealing against a pressure differential. Any one or more of the various gasket embodiments disclosed herein can be used in a wide range of applications to provide EMI shielding, environmental sealing, and/or sealing against a pressure differential. By way of example, a gasket disclosed herein can be used with submersible devices, such as cameras and vehicles, as well as other enclosures intended to protect equipment from the ingress of driven rain, pooled liquids, sand, dust, and/or pressure changes, etc.

In regard to gaps associated with structures, manufacturing variability, thermal expansion/contraction, assembly stresses, and vibration often combine to require a gasket design that is capable of functioning over a wide range of potential gap sizes. These demands, however, are usually inapposite with other demands, such as cost, weight, and size restrictions. Accordingly, a gasket design capable of satisfying all of these demands will have excellent applicability for providing gasketing solutions across a very broad spectrum.

In one aspect of the present disclosure, the inventor hereof was faced with the particularly daunting task of developing gaskets capable of satisfying the following set of fairly rigorous requirements:

a base member that allows the gasket to be adhesively mounted (e.g., with a pressure sensitive adhesive, etc.) to a surface, such as a generally flat and planar surface, a surface with a compound curvature, etc.;

compression between generally locally parallel opposing surfaces (or initially nonparallel substrate surfaces such as a closing hinged door), which may engage the gasket such that the compression may be normal with zero degree shear motion up to a shear angle of fifty-one degrees (e.g., forty-five degree shear means equal compression and lateral components of motion);

substantially continuous electrical contact along the path of the gasket from a gap of 0.295 inch down to a gap of 0.134 inch;

substantially continuous sealing against both EMI and an air pressure differential of at least 6.4 pounds per square inch (across the width of the gasket cross-section) when the gasket is compressed for fitting within a gap ranging in size from 0.295 inch to 0.185 inch;

substantially continuous sealing against EMI and an air pressure differential of at least 8.6 pounds per square inch when the gasket is compressed for fitting within a gap ranging in size from 0.185 inch to 0.134 inch gap;

gasket force not exceeding thirty-two pounds per inch of gasket length over a range of compression from 0.295 inch gap to 0.134 inch gap;

during compression, gasket overall width or lateral expansion that is minimized or significantly reduced;

gasket capable of functioning for at least tens of compression cycles;

gasket capable of functioning when made to traverse and follow a curved path having a minimum centerline radius of 0.825 inch;

gasket material that is fuel-tolerant such that the gasket won't degrade in the presence of jet fuel and/or liquids used for nuclear-biological-chemical wash down; and gasket capable of functioning between temperature extremes of minus fifty-five degrees Celsius and one hundred sixty degrees Celsius.

To this end, the inventor hereof succeeded in developing various embodiments of gaskets capable of satisfying the above-listed criteria.

Figure 2:
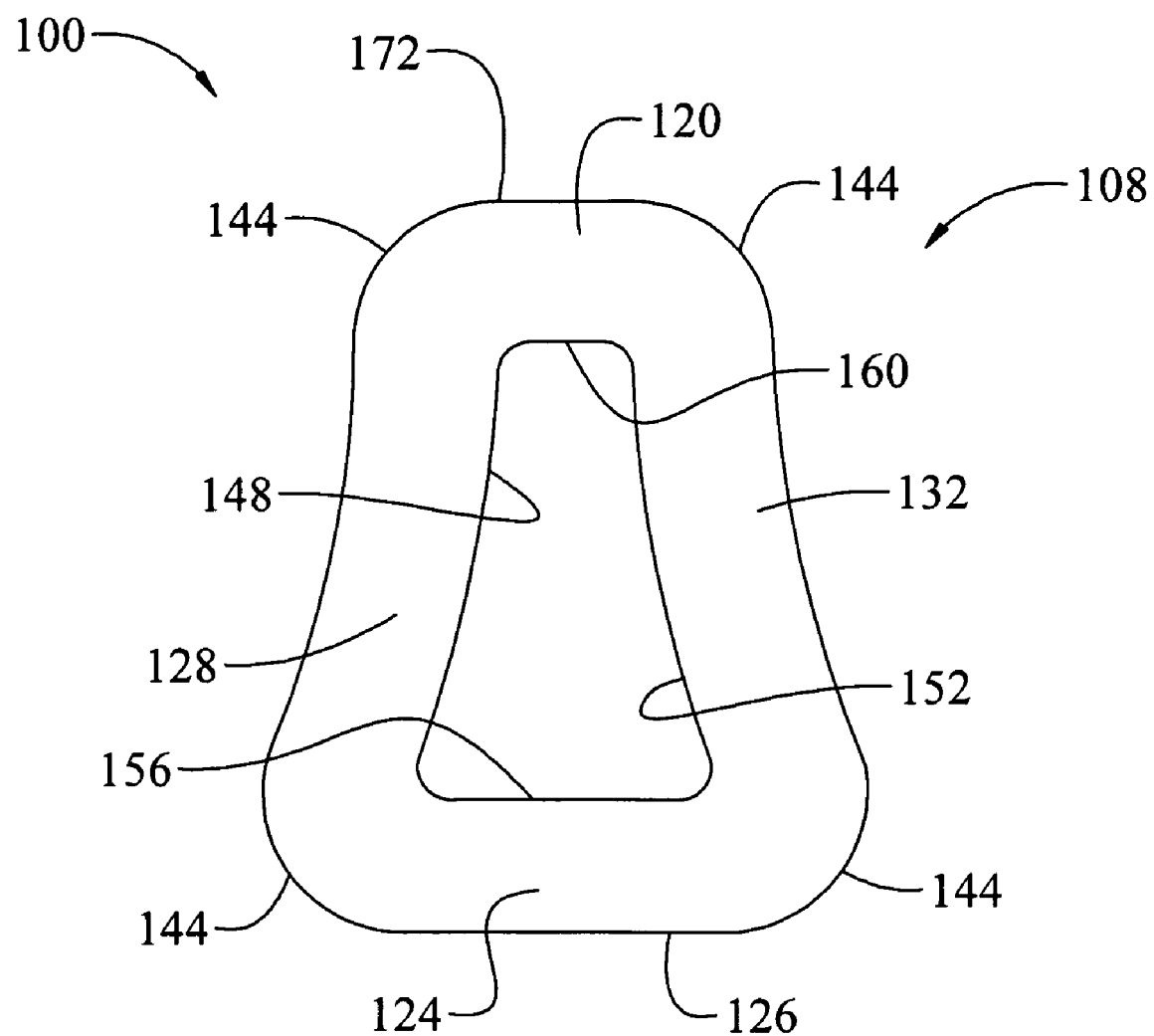
FIG. 2 is an end elevation view of the gasket shown in FIG. 1.

With reference now to FIGS. 1 and 2, a description will now be provided of an exemplary embodiment of a gasket 100 capable of meeting the fairly rigorous criteria mentioned above. In this particular embodiment, the gasket 100 includes a tubular or annular body 104. The body 104 has a closed generally trapezoidal cross-sectional geometry 108. The body 104 has continuous interior and exterior surfaces 112, 116 defining wall thicknesses therebetween.

As noted below in regard to FIG. 3, a preferred embodiment of the gasket 100 includes a thickness T1 of about 0.062 inch (with a tolerance of about +/−0.005 inch), a thickness T2 of about 0.065 inch (with a tolerance of about +/−0.005 inch), a thickness T3 of about 0.065 inch (with a tolerance of about +/−0.005 inch), and a thickness T4 of about 0.065 inch (with a tolerance of about +/−0.005 inch). Advantageously, some embodiments provide the top member with a wall thickness greater than the wall thickness of the base member in order to minimize (or at least reduce) the compressive force at the lower gap sizes (e.g., 0.134 inch gap, etc.) by delaying the abutting contact (e.g., 164 and 168 shown in FIG. 4 and described below), thus extending the deflection range over which the gasket force remains relatively constant. Alternatively, other wall thickness can be employed, and some embodiments may include a gasket having a generally uniform wall thickness completely therearound for ease of manufacturing.

With continued reference to FIG. 2, the gasket 100 includes a top member 120, a base member 124, and first and second lateral members 128, 132. These four members 120, 124, 128, 132 cooperatively define the approximately trapezoidal gasket profile 108. As shown in FIG. 2, the base member 124 is wider than the top member 120. The first and second lateral members 128 and 132 are bowed, arced, or curved slightly inwardly relative to each other.

The gasket 100 may be configured for interposition between first and second surfaces (e.g., surfaces 136, 140 as shown in FIG. 4, etc.). In some preferred embodiments, the base member 124 is configured such that its outer surface 126 will conform to a second surface, while the outer surface 172 of the top member 124 is generally parallel with an upper surface. In the embodiment illustrated in FIG. 1, the top and base members 120, 124 are generally parallel to each other. In addition, the outer surface 126 of the base member 124 is shown generally flat. Likewise, the outer surface 172 of the top member 124 is also shown generally flat. In other embodiments, either or both of these outer surfaces may be configured differently depending, for example, on the particular application. For example, some embodiments may have the gasket's top and/or base member being bowed, arced, or curved slightly inwardly.

The lateral members 128, 132 are connected to the top and base members 120, 124 such that the gasket 100 includes four generally rounded or curved corner portions or intersections 144. The lateral members 128, 132 extend from the top member 120 to intersect the base member 124. The lateral members 128, 132 convexly curve or bow generally inwardly towards each other.

In some preferred embodiments, an acute angle is defined generally between the inner surface 148, 152 of each lateral member 128, 132 and the inner surface 156 of the base member 124. Alternative embodiments, however, may include an obtuse angle or a right angle defined generally between the inner surface 148, 152 of each lateral member 128, 132 and the inner surface 156 of the base member 124. In addition, some embodiments are configured such that the angles defined generally between the inner surface 148, 152 of each lateral member 128, 132 and the inner surface 156 of the base member 124 are not the same size.

In some preferred embodiments, an obtuse angle is defined generally between the inner surface 148, 152 of each lateral member 128, 132 and the inner surface 160 of the top member 120. Alternative embodiments, however, may include an obtuse angle or a right angle defined generally between the inner surface 148, 152 of each lateral member 128, 132 and the inner surface 160 of the top member 120. In addition, some embodiments are configured such that the angles defined generally between the inner surface 148, 152 of each lateral member 128, 132 and the inner surface 160 of the top member 120 are not the same size.

Depending on the particular installation, the outer surface 126 of the gasket's base member 124 may be secured to a support surface with adhesive (e.g., pressure sensitive adhesive, glue, double-sided tape, etc.). Alternatively, other suitable attachment methods can also be employed depending, for example, on the particular location or gap in which the gasket 100 will be installed.

By way of example, the gasket 100 may be installed within a gap between two generally parallel and opposing substrate surfaces (e.g., surfaces 136 and 140 shown in FIG. 4, etc.). The outer surface 126 of the gasket's base member 124 may be adhered to one of the two substrate surfaces, and the outer surface 172 of the gasket's top member 120 may be engaged by the other substrate surface to compress the gasket 100.

The body 104 preferably includes a generally hollow extrusion of elastomer material. In various embodiments, the gasket 100 is formed by extruding an electrically-conductive elastomer material, such as silicone or fluorosilicone rubber rendered electrically-conductive by its loading with a silver-based filler and/or a nickel-based filler. Alternatively, a wide range of other materials can also be used for the gasket 100, including dielectric elastomeric materials. Likewise, other manufacturing processes besides extrusion can also be employed, such as molding, die-cutting, etc. In this regard, die-cutting may involve forming the gasket from a cured sheet of an electrically-conductive elastomer, which is cut or stamped using a die or the like into the desired configuration. Molding, in turn, may involve the compression, transfer, or injection molding of an uncured or thermoplastic elastomer into the desired configuration. The materials and manufacturing processes described herein are illustrative only, as the gasket 100 can be formed from different materials and/or by different manufacturing processes.

Figure 5:
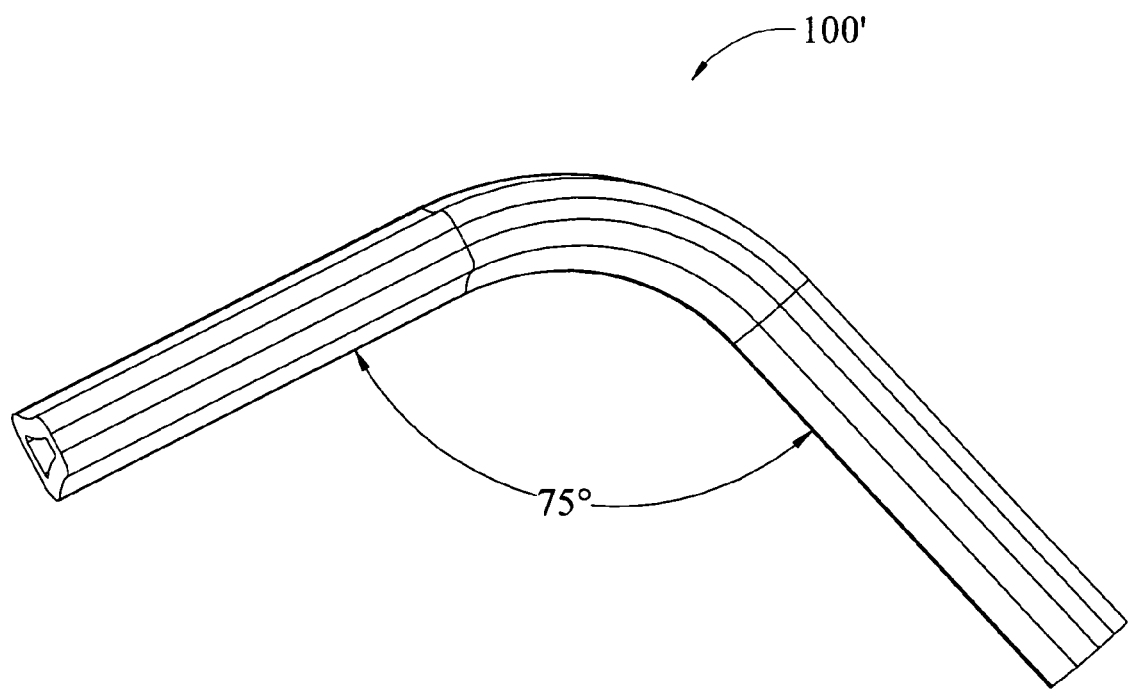
FIG. 5 is a perspective view of a seventy-five degree curved length of gasket having the profile shown in FIG. 2 according to exemplary embodiments.
Figure 6:
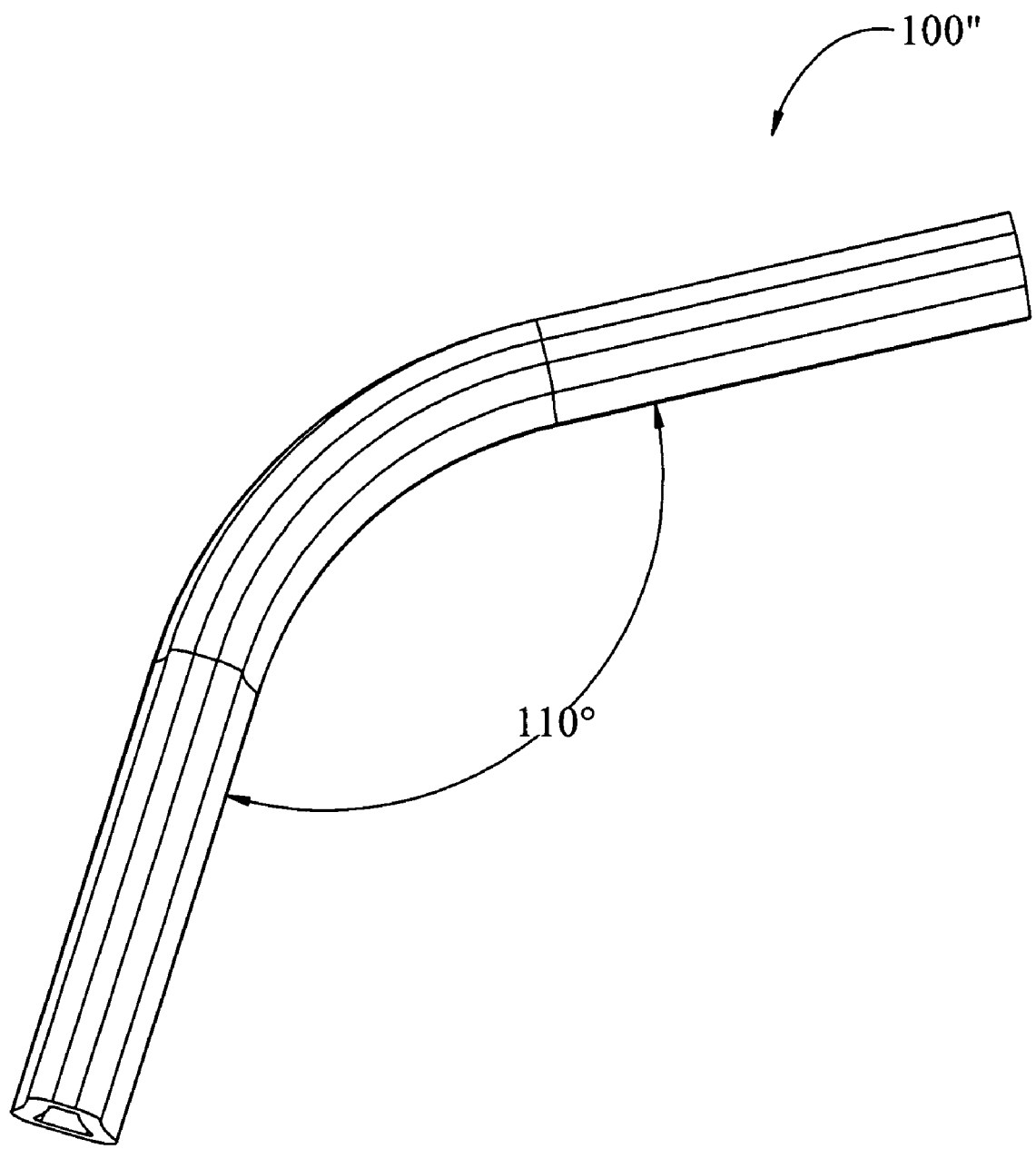
FIG. 6 is a perspective view of a one hundred ten degree curved length of gasket having the profile shown in FIG. 2 according to exemplary embodiments.

With continued reference to FIG. 1, the body 104 is shown having indefinite length. The gasket 100, however, may be cut, sectioned, or otherwise terminated for a custom fit at a particular location. In other words, the length of the gasket 100 can vary depending on the intended use of the gasket 100. The gasket 100 can be provided with a relative straight gasket length (FIG. 1), or the gasket 100 can be provided with a curved gasket length (e.g., gasket 100' shown in FIG. 5, gasket 100" shown in FIG. 6, etc.). For example, FIG. 5 illustrates an exemplary gasket 100' having a seventy-five degree curved gasket length that is about 4.74 inches long with a plan view gasket centerline radius of curvature of 0.825 inch. FIG. 6 illustrates an exemplary gasket 100" having a one hundred ten degree curved gasket length that is about 4.278 inches long with a plan view gasket centerline radius of curvature of 0.825 inch. Alternative embodiments include gaskets having a different length, a different curved path bend angle, a different centerline radius of curvature, combinations thereof, etc. depending, for example, on the particular location and gap in which the gasket will be installed.

Figure 3:
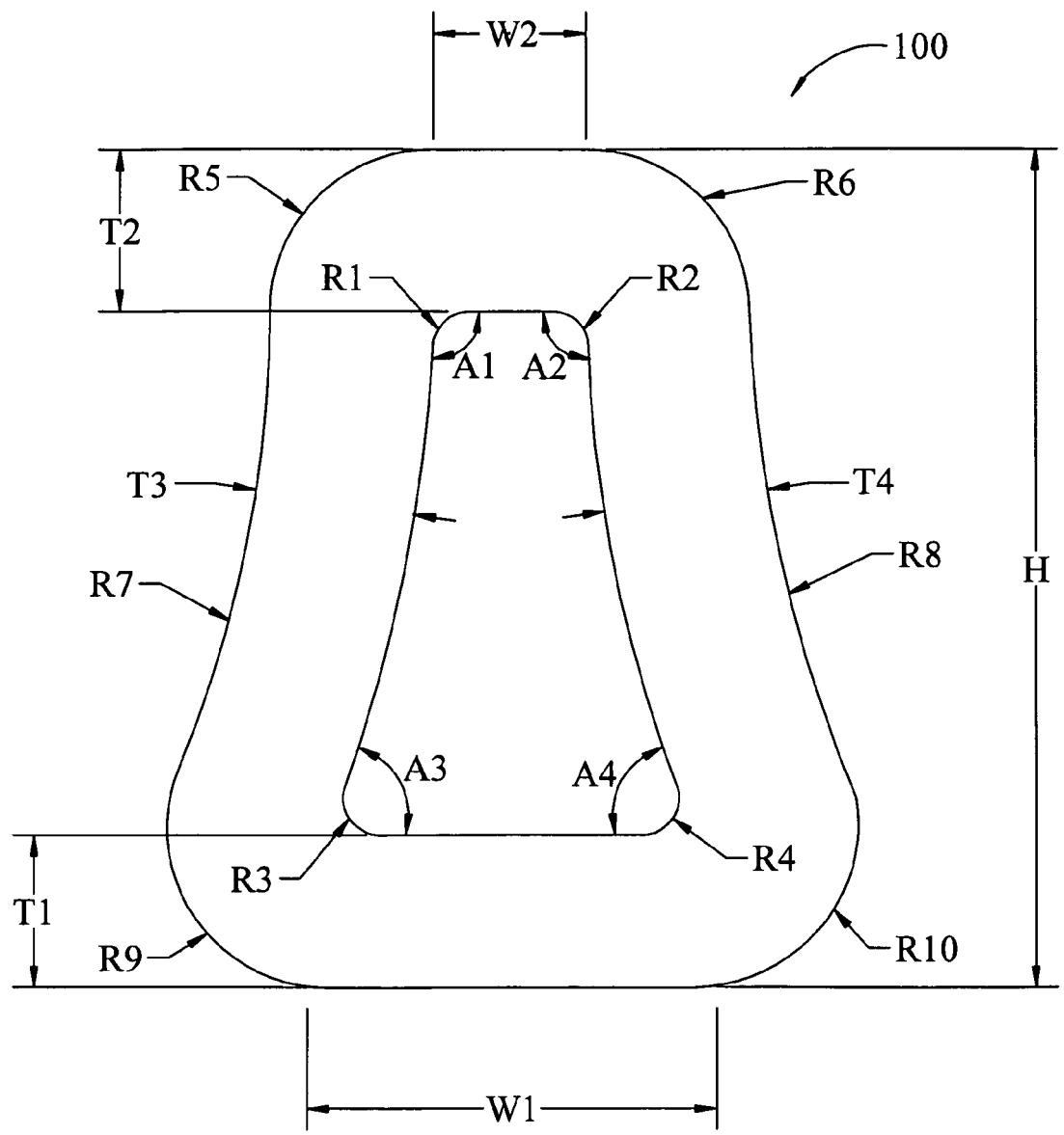
FIG. 3 is another end elevation view of the gasket profile shown in FIG. 2 with reference characters identifying various dimensional parameters that are disclosed hereinafter for purposes of illustration only according to exemplary embodiments.

With reference now to FIG. 3, exemplary dimensions will be provided for one particular exemplary embodiment when the gasket 100 is uncompressed. These dimensions are provided (as are all dimensions disclosed herein) as mere examples for purposes of illustration only. In other embodiments, a gasket can be configured with different dimensions depending, for example, on the particular location at which the gasket is to be used, space considerations, compression requirements, EMI shielding requirements, environmental sealing requirements, differential pressure sealing requirements, combinations thereof, etc.

Continuing with the exemplary embodiment shown in FIG. 3, the gasket 100 may be configured to have the following dimensions:
- a height H of about 0.340 inch (with a tolerance of about +/−0.012 inch);
- a width W1 of about 0.275 inch (with a tolerance of about +/−0.010 inch);
- a width W2 of about 0.060 inch (with a tolerance of about +/−0.005 inch);
- a thickness T1 of about 0.062 inch (with a tolerance of about +/−0.005 inch);
- a thickness T2 of about 0.065 inch (with a tolerance of about +/−0.005 inch);
- a thickness T3 of about 0.065 inch (with a tolerance of about +/−0.005 inch);
- a thickness T4 of about 0.065 inch (with a tolerance of about +/−0.005 inch);
- a radius of curvature R1 of about 0.015 inch (with a tolerance of about +/−0.005 inch);
- a radius of curvature R2 of about 0.015 inch (with a tolerance of about +/−0.005 inch);
- a radius of curvature R3 of about 0.015 inch (with a tolerance of about +/−0.005 inch);
- a radius of curvature R4 of about 0.015 inch (with a tolerance of about +/−0.005 inch);
- a radius of curvature R5 of about 0.065 inch (with a tolerance of about +/−0.005 inch);
- a radius of curvature R6 of about 0.065 inch (with a tolerance of about +/−0.005 inch);
- a radius of curvature R7 of about 0.567 inch (with a tolerance of about +/−0.100 inch);
- a radius of curvature R8 of about 0.567 inch (with a tolerance of about +/−0.100 inch);
- a radius of curvature R9 of about 0.065 inch (with a tolerance of about +/−0.005 inch);
- a radius of curvature R10 of about 0.065 inch (with a tolerance of about +/−0.005 inch);
- an angle A1 of about 92.9 degrees (with a tolerance of about +/−3 degrees);
- an angle A2 of about 92.9 degrees (with a tolerance of about +/−3 degrees);
- an angle A3 of about 70.5 degrees (with a tolerance of about +/−3 degrees);
- an angle A4 of about 70.5 degrees (with a tolerance of about +/−3 degrees); and
- a cross-sectional area of about 0.05447 square inches.

In order to further illustrate various aspects of the present disclosure and possible advantages thereof, the following non-limiting modeling and test results are given for purposes of illustration. This modeling behavior and test results are provided to help illustrate various aspects of the gasket embodiments disclosed herein.

FIGS. 4A through 4D are graphical illustrations of a finite element model showing, in cross-section, predicted strain distributions for various stages as the gasket 100 is compressed between generally parallel and opposite substrate surfaces 136 and 140. For this particular modeling example, the gasket's base member 124 was adhesively attached to the lower substrate surface 140, and the gasket 100 is being compressed by the upper substrate surface 136 engaging the gasket's top member 120 with zero shear motion.

Figure 4A:
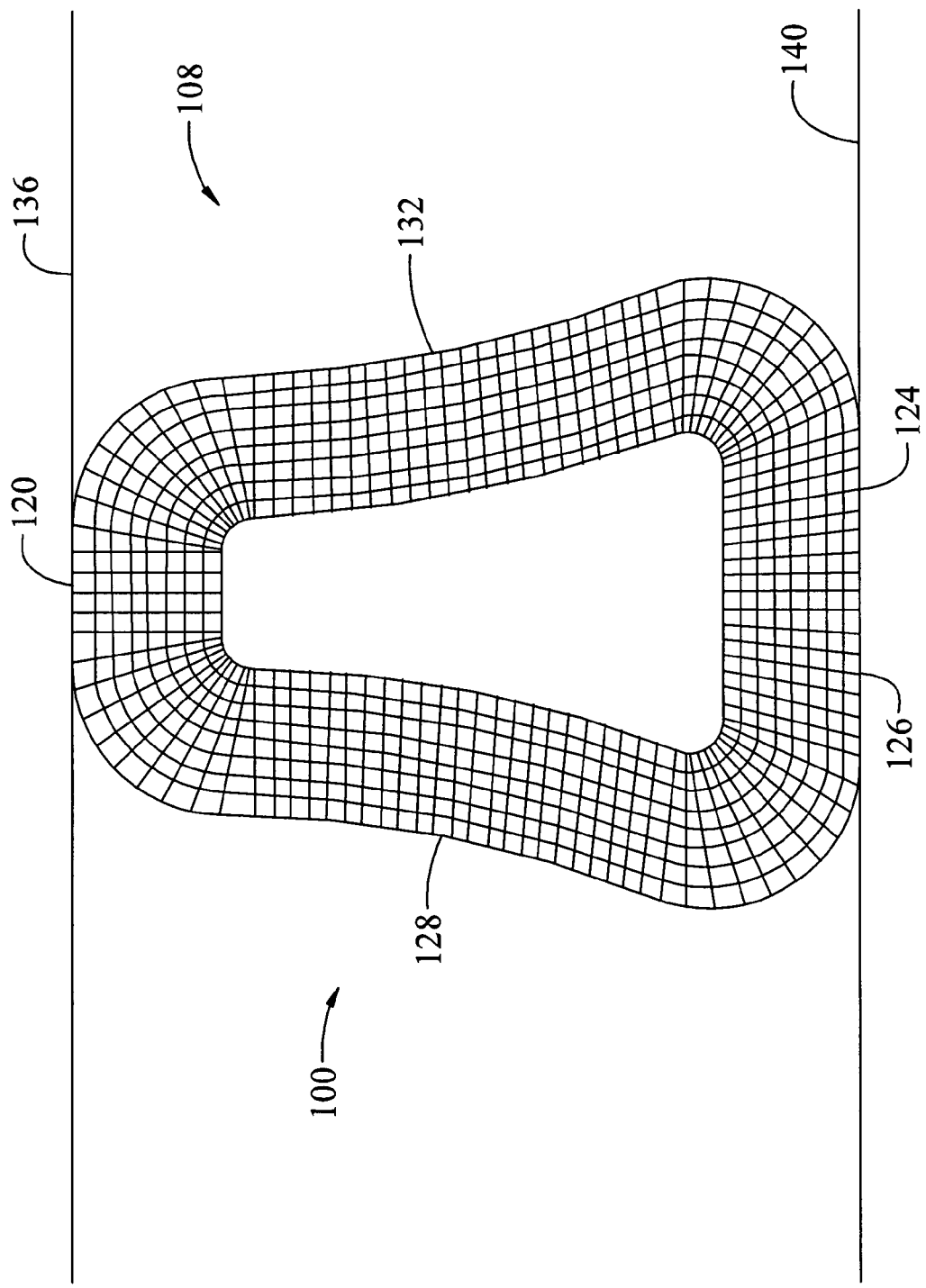
FIGS. 4A through 4D are graphical representations of a finite element model showing, in cross-section, predicted strain distributions for various stages of the gasket shown in FIG. 1 being compressed between generally parallel and opposite substrate surfaces.
Figure 4B:
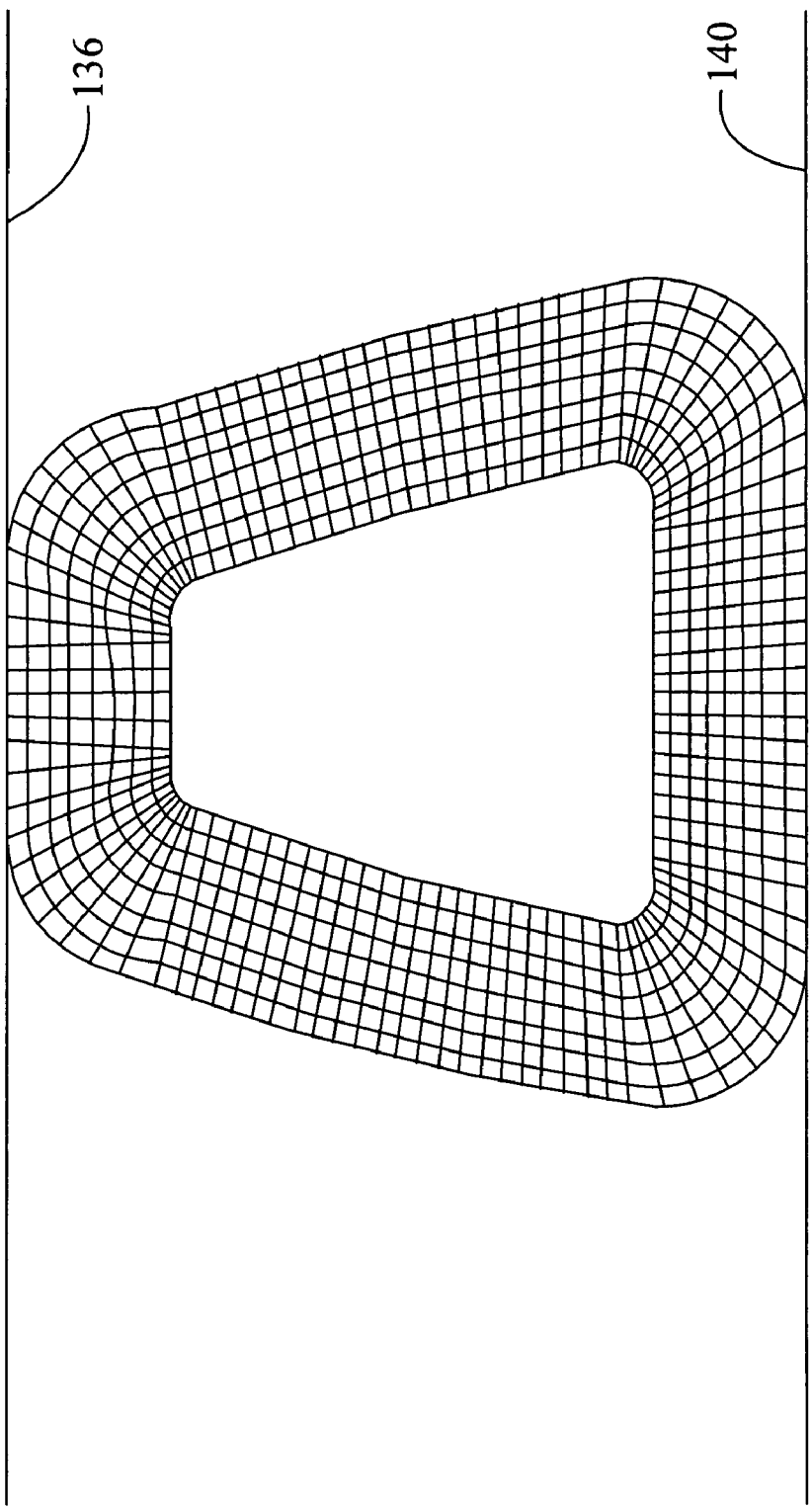
Figure 4C:
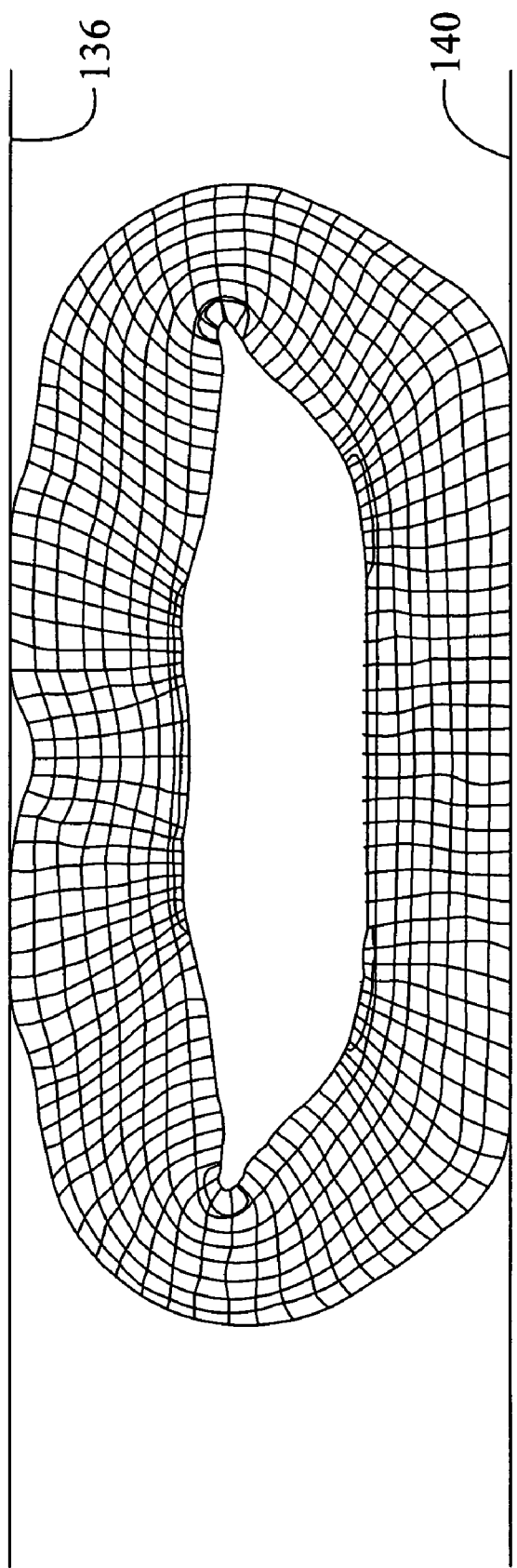
Figure 4D:
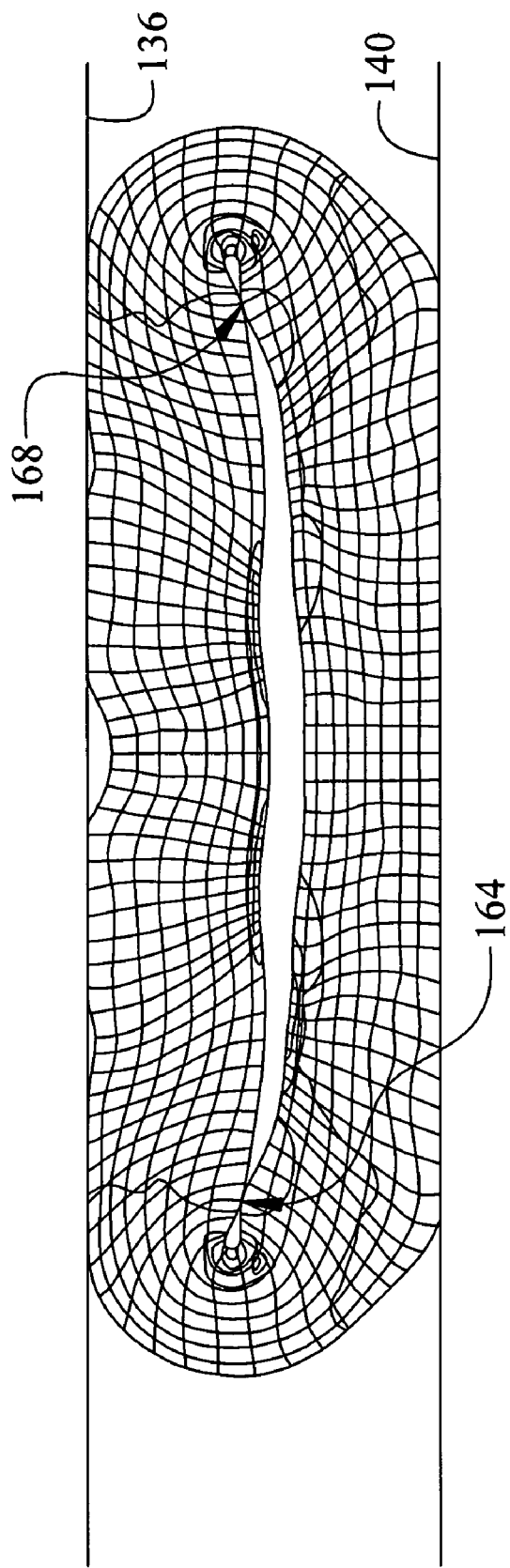

Generally, FIG. 4A shows the gasket 100 in an uncompressed free-standing orientation. FIG. 4D shows the gasket 100 in a collapsed orientation as compressed between the substrate surfaces 136 and 140 at a predetermined gap of 0.134 inch, resulting in a compressive force of about twenty pounds per inch of gasket length. FIGS. 4B and 4C show intermediate gasket compression stages.

In these FIGS. 4A through 4D, the gasket 100 was modeled with an adhesive bonding the outer surface 126 of the gasket's base member 124 to the lower substrate surface 140, where the adhesive has infinite peel strength and infinitesimal thickness. It was also assumed that the upper and lower substrate surfaces 136 and 140 were perfectly rigid. It was further assumed that the gasket 100 was softened or conditioned after repeated compression a few times, but has not taken any permanent reduction in free height as a result. Other assumptions included that no gasket strain occurs along the length of the gasket, such that the analysis disregarded the tendency of gasket length to increase during compression and the complex deformation behavior that typically occurs at vulcanized miter joints or along curved gasket paths. The friction coefficient between all surfaces was assumed to be 0.6.

Looking initially to FIG. 4A, the gasket 100 has a generally trapezoidal profile 108 when uncompressed and free-standing. This generally trapezoidal profile 108 is collectively defined by the gasket's top member 120, base member 124, and lateral members 128, 132. FIGS. 4B and 4C show the manner in which the lateral members 128, 132 change configuration as the gasket 100 is being compressed between the substrate surfaces 136 and 140. The lateral members 128, 132 initially have a generally convex curvature relative to each other, as shown in FIG. 4A. But as the gasket 100 compresses, medial portions of the lateral members 128, 132 move outwardly away from each other. As shown in FIG. 4B, the lateral members 128, 132 are substantially straight, generally acting like columns to bring gasket force quickly up to a functional level. But with continued gasket compression, the lateral members 128, 132 eventually begin to bow outwardly as shown in FIG. 4C, thereby minimizing (or at least reducing) increases in gasket force by forcing the lateral members 128, 132 to carry more of this force in bending and less in axial compression.

Ultimately, the gasket 100 when sufficiently compressed will transform into the collapsed orientation shown in FIG. 4D. This collapsed orientation is characterized in that upper and lower inner surface portions of the first lateral member 128 are in an abutting, force transferring relationship with each other (as generally designated by reference number 164), and upper and lower inner surface portions of the second lateral member 132 are in an abutting, force transferring relationship with each other (as generally designated by reference number 168). Also shown in FIG. 4D, outer surface portions of the respective lateral members 128, 132 are in contact with the upper substrate surface 136.

Figure 7A:
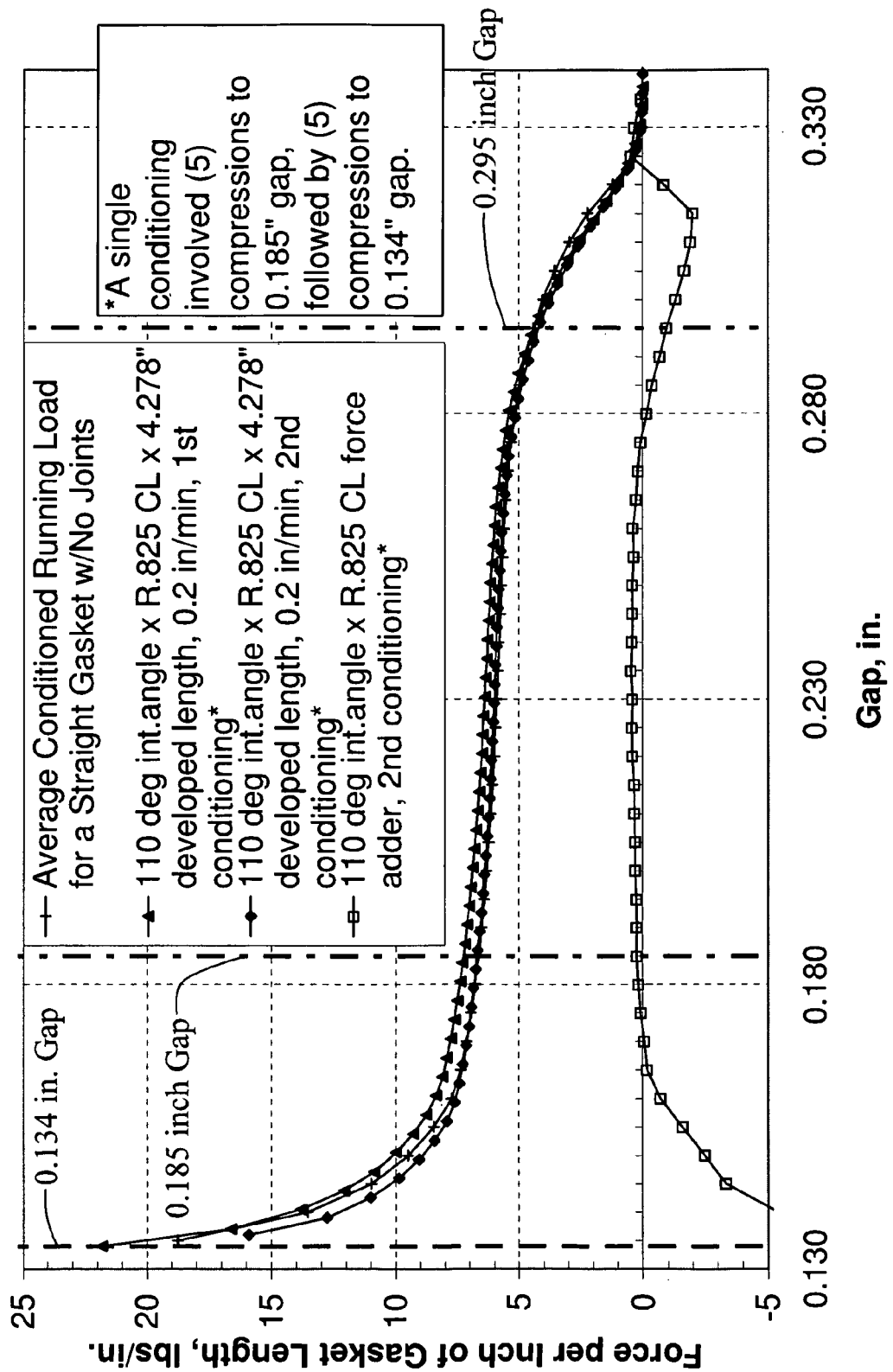
FIGS. 7A and 7B are exemplary line graph of force versus deflection behavior showing gasket force per inch of gasket length at different gap sizes for the relatively straight gasket length shown in FIG. 1, and for the curved gasket lengths shown in FIGS. 5 and 6.
Figure 7B:
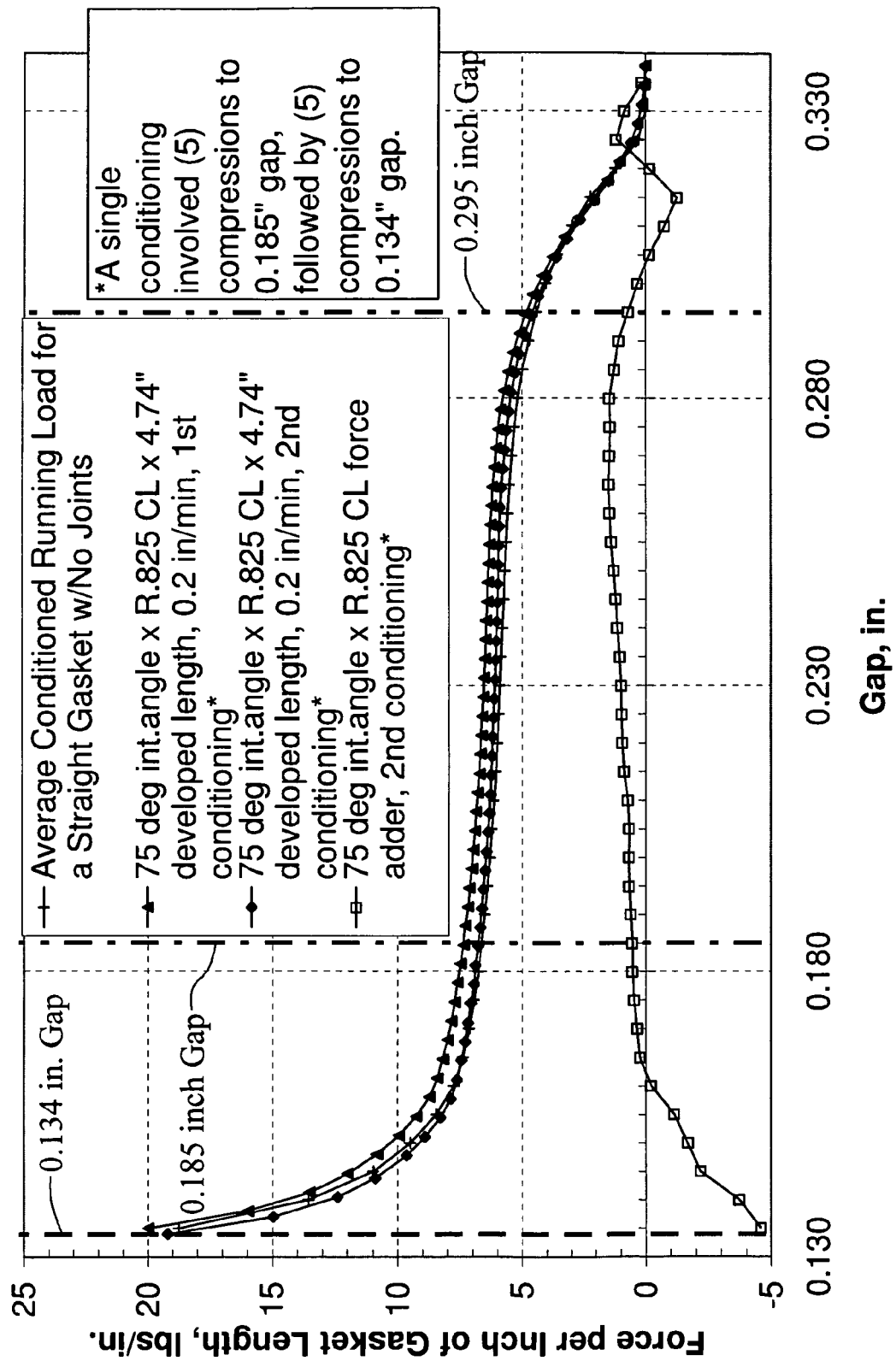

FIGS. 7A and 7B are exemplary line graphs of gasket force per inch of gasket length versus gap size for the relatively straight gasket length shown in FIG. 1, the seventy-five degree curved gasket length shown in FIG. 5, and the one hundred ten degree curved gasket length shown in FIG. 6. As can be seen in FIGS. 7A and 7B, the gasket force remains relatively constant over a fairly large deflection range. Accordingly, the gasket force per inch of gasket length over a predetermined compression range has a general shape characterized by three slope regions, including a fairly quick ramp-up to functional force starting from the free height of the gasket, followed by relatively constant force over a large compression range (e.g., approximately one-third of the free gasket height or about 0.280 inch gap down to about 0.165 inch gap), and then followed by an inevitable and relatively quick ramp-up in force as the gasket begins abutting itself (e.g., as shown by areas 164 and 168 in FIG. 4, etc.). In some preferred embodiments, the gasket is configured such that the gasket force per inch length does not change by more than about sixty percent for a range of compression from a gap of about eighty-two percent of the free gasket height (e.g., 0.280 inch gap in some embodiments, etc.) down to a gap of about forty-nine percent of the free gasket height (e.g., 0.165 inch gap in some embodiments, etc.). In addition, some embodiments include a gasket configured such that the gasket exhibits a force at a gap of 0.165 inch that is about fifty percent higher than the force at a 0.280 gap.

These aspects and features relating to constancy of gasket force over a large range of compression is what helps allow various embodiments of the gasket 100 to be able to seal against an air pressure differential of at least about 6.4 pounds per square inch when the gasket is compressed to a gap size between about 0.295 inch to about 0.185 inch, and also to seal against an air pressure differential of at least about 8.6 pounds per square inch without exceeding a gasket force of about thirty-two pounds per inch of gasket length when the gasket is compressed to a gap size between about 0.185 inch to about 0.134 inch. In cases where the sealing of a pressure differential is not required or necessary, the constancy of gasket force over a relatively large deflection range can also provide a reliable seal against the transfer of such materials as driven rain, dust, pooled liquids, gases, etc., especially in situations where gasket gap cannot be precisely controlled, and without overstressing assembly components or making it hard to close doors, etc.

Also shown in FIGS. 7A and 7B, the "force adder" curves generally show that making the gasket 100 follow a curved path (e.g., seventy-five degree curved gasket length (FIG. 5), one hundred ten degree curved gasket length (FIG. 6), etc.) has only a small effect on the gasket force. By way of background, a "force adder" is the gasket force per unit length for a curved gasket section minus the gasket force per unit length for a straight gasket section. In other words, gluing or adhesively attaching the gasket 100 down into a curved path changes the load versus deflection behavior a little or insignificantly. This testing was performed on the two different curved paths shown in FIGS. 5 and 6. More specifically, FIG. 5 shows a curved path of seventy-five degrees where the total gasket length was 4.74 inches with a plan view gasket centerline radius of curvature of 0.825 inch. FIG. 6 shows a curved path of one hundred ten degrees where the total gasket length was 4.278 inches with a plan view gasket centerline radius of curvature of 0.825 inch. As shown by FIG. 7, curving the gasket's path did not significantly change the overall gasket performance.

Figure 8:
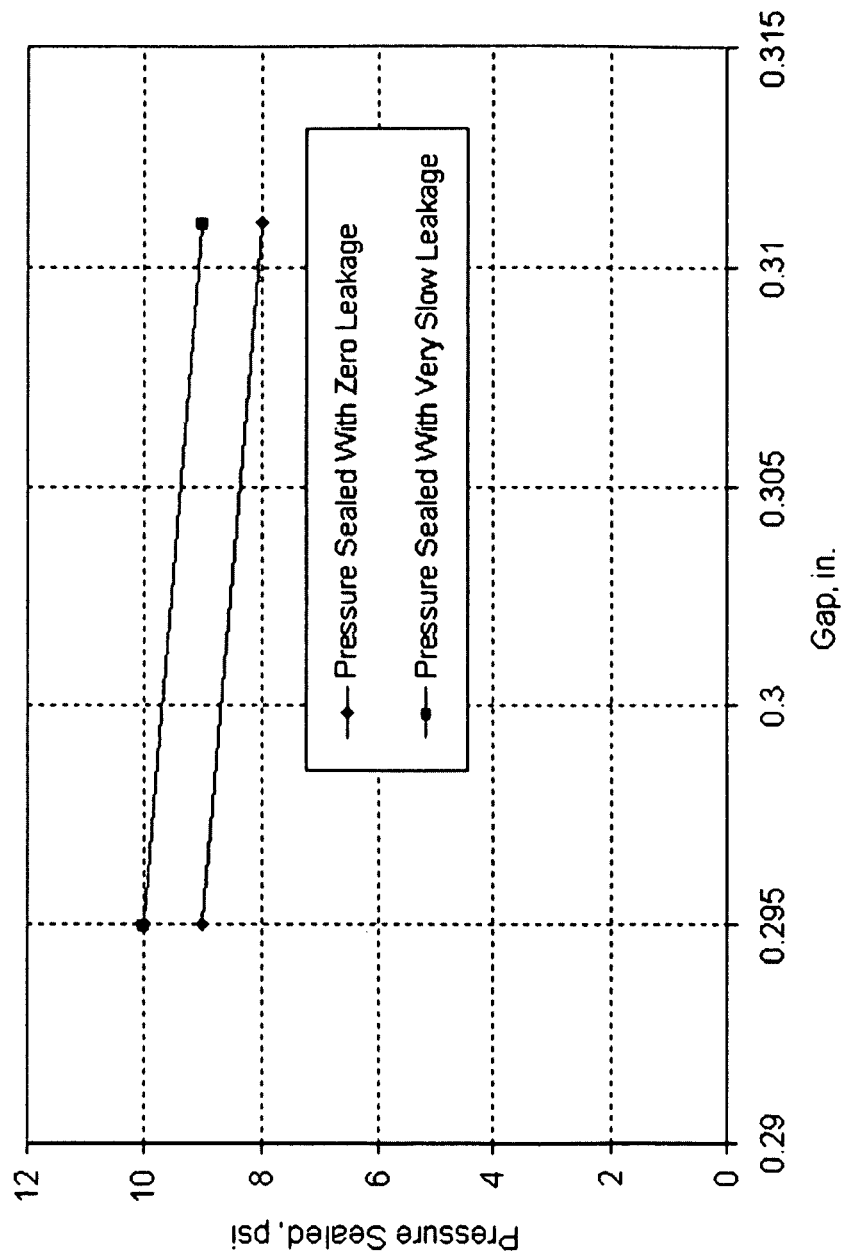
FIG. 8 is an exemplary line graph depicting data acquired from pressure testing that illustrates the ability of the gasket shown in FIG. 1 to seal against a pressure differential at different gap sizes.

FIG. 8 is an exemplary line graph depicting data acquired by pressure testing the gasket 100 after the gasket 100 was compressed to a height of 0.137 inch six times and released completely after each compression. This graph generally illustrates the ability of the gasket 100 to seal against relatively large pressure differentials over a relatively large range of compression with a gap size ranging between 0.295 inch and 0.311 inch.

As shown by the pressure testing results in FIG. 8, the gasket 100 sealed a 0.295 inch gap against a pressure differential of about 8.5 psi with zero leakage and about 10 psi with very slow leakage. FIG. 8 also shows that the gasket 100 sealed a 0.311 inch gap against a pressure differential of about 8 psi with zero leakage and about 8.5 psi with very slow leakage.

FIG. 8 does not illustrate pressure testing results for the gasket 100 at gap sizes less than 0.295 inch. But the gasket 100 should seal against pressure differentials of 8.5 psi or higher when the gasket 100 is compressed within gaps less than 0.295 inch. This is because prior testing has shown a trend for gaskets (including testing of gasket 200 described below), where increasing compression due to decreasing gap size led to greater sealing capacity. Therefore, increasing the gasket force as a result of greater compression within a smaller gap size should increase the gasket's sealing ability.

Figure 9:
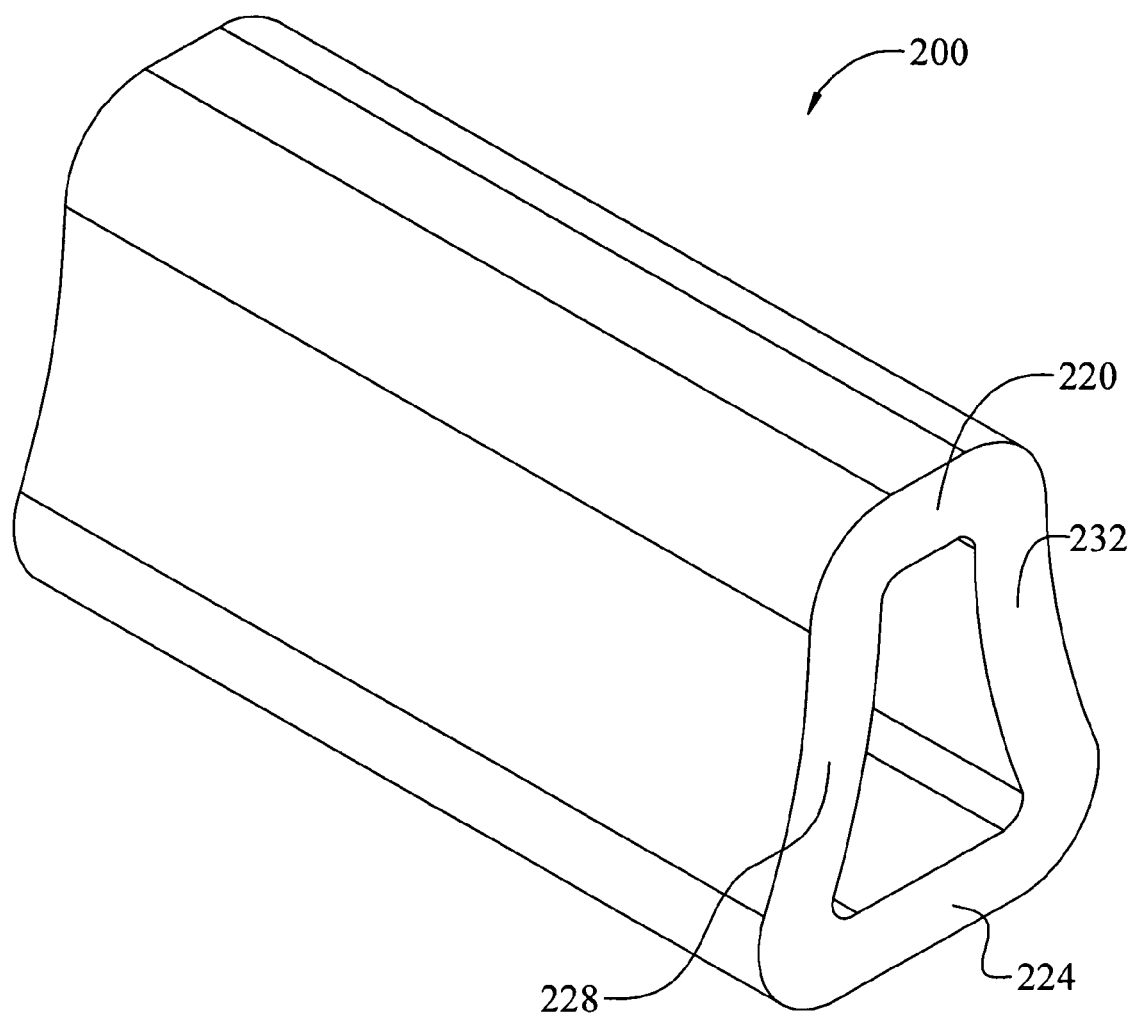
FIG. 9 is a perspective end view of another EMI shielding and/or environmental sealing gasket according to exemplary embodiments.
Figure 10:
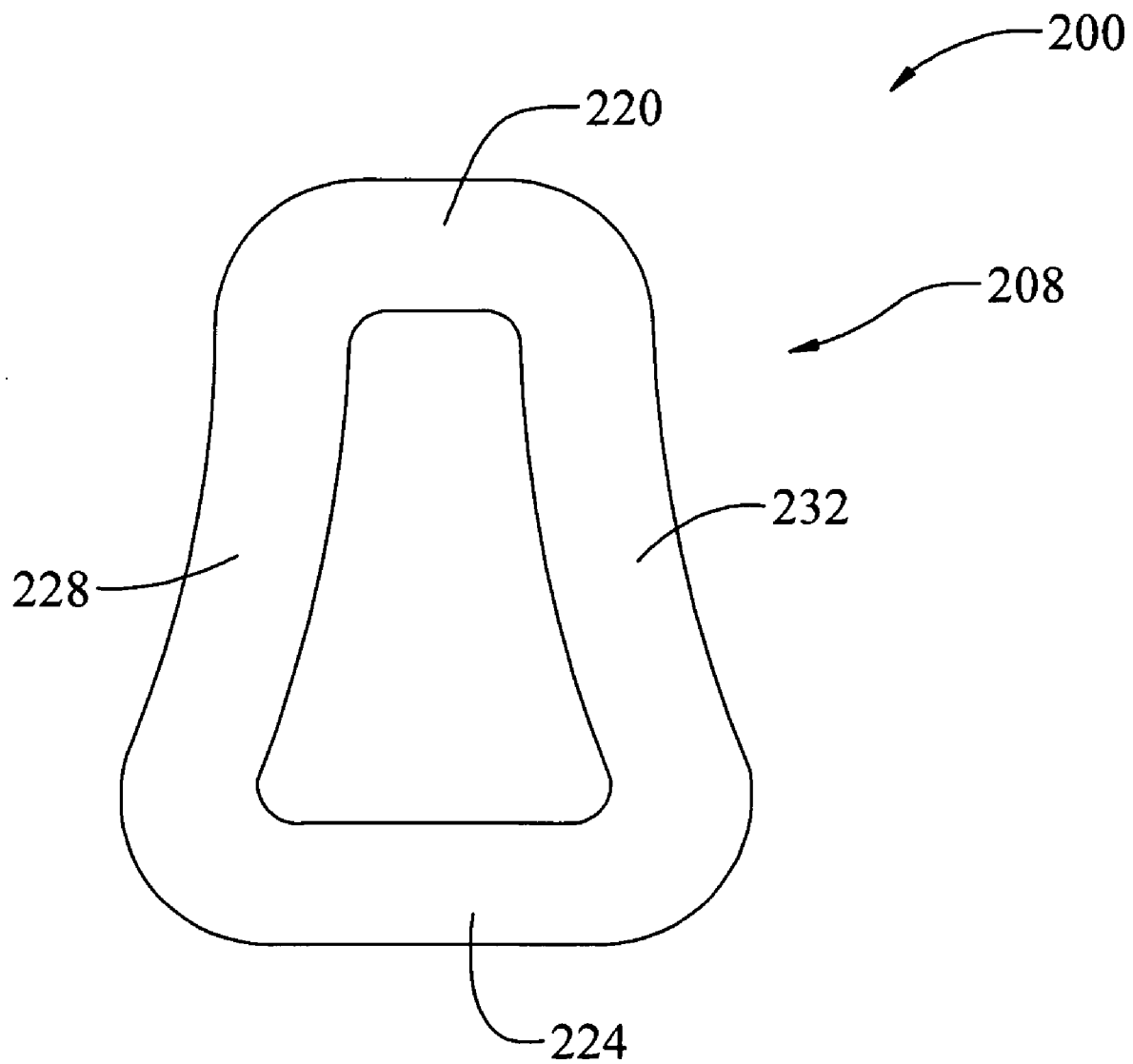
FIG. 10 is an end elevation view of the gasket shown in FIG. 9.

FIGS. 9 and 10 illustrate an alternative embodiment of a gasket 200. By way of comparison to gasket 100, the gasket 200 may be thinner walled for some embodiments. Topologically, however, the gaskets 100 and 200 may have substantially similar generally trapezoidal profiles. The gaskets 100 and 200 are substantially similar proportionally but their general proportions may vary in scale. In this regard, various embodiments may include gaskets having dimensions scaled upwards or downwards depending, for example, on the particular needs of an application or customer, while generally maintaining the same general proportions as disclosed for gasket 100 or 200.

By way of example, the illustrated embodiment of gasket 200 includes a top member 220, a base member 224, and first and second lateral members 228, 232. These four members 220, 224, 228, 232 cooperatively define the approximately trapezoidal gasket profile 208. As shown in FIG. 10, the base member 224 is wider than the top member 220. The first and second lateral members 228 and 232 are bowed, arced, or curved slightly inwardly relative to each other.

Depending on the particular application, the profile of the gasket 200, however, may prove advantageous in that the cross-sectional area thereof may be less than the cross-sectional area of some embodiments of the gasket 100, which may, in turn, allow for gasket production with less material. By way of example, one particular embodiment of the gasket 200 is configured such that its cross-sectional area is about 0.05 square inches, as compared to an exemplary embodiment of the gasket 100 having a cross-sectional area of about 0.05447 square inches. These dimensions (as are all dimensions herein) are provided for purposes of illustration only. Alternatively, other cross-sectional areas can be employed for the gasket 100 or gasket 200.

Figure 11:
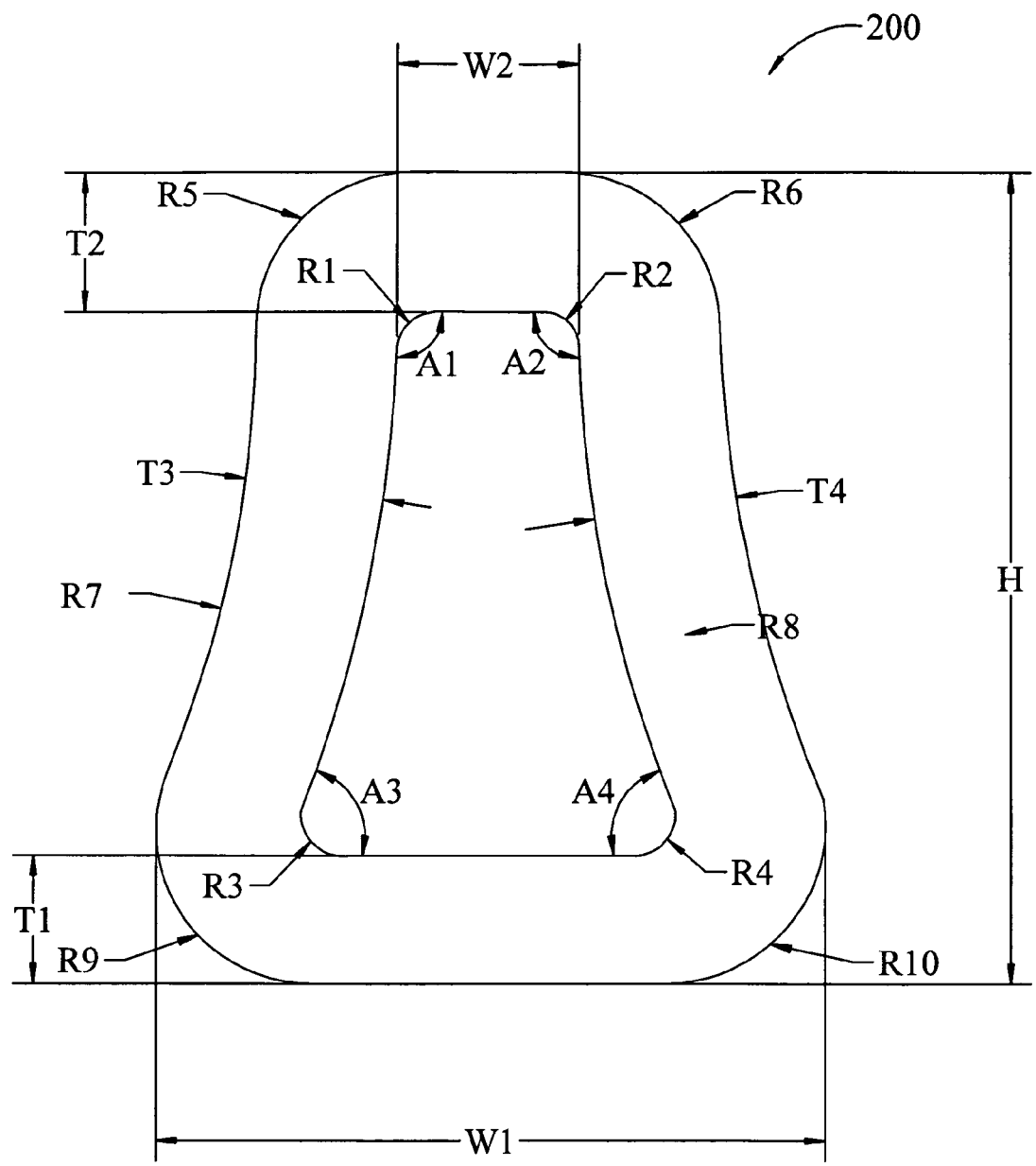
FIG. 11 is another end elevation view for the gasket profile shown in FIG. 2 with reference characters identifying various dimensional parameters that are disclosed hereinafter for purposes of illustration only according to exemplary embodiments.

With reference to FIG. 11, exemplary dimensions will now be provided for one particular embodiment when the gasket 200 is uncompressed or free-standing. These dimensions are provided (as are all dimensions disclosed herein) as mere examples for purposes of illustration only. In other embodiments, a gasket can be configured with different dimensions depending, for example, on the particular location at which the gasket is to be used, space considerations, compression requirements, EMI shielding requirements, environmental sealing requirements, differential pressure sealing requirements, combinations thereof, etc.

Continuing with the exemplary embodiment shown in FIG. 11 the gasket 200 may have the following dimensions:
- a height H of about 0.340 inch (with a tolerance of about +/−0.012 inch);
- a width W1 of about 0.275 inch (with a tolerance of about +/−0.010 inch);
- a width W2 of about 0.060 inch (with a tolerance of about +/−0.005 inch);
- a thickness T1 of about 0.055 inch (with a tolerance of about +/−0.005 inch);
- a thickness T2 of about 0.058 inch (with a tolerance of about +/−0.005 inch);
- a thickness T3 of about 0.058 inch (with a tolerance of about +/−0.005 inch);
- a thickness T4 of about 0.058 inch (with a tolerance of about +/−0.005 inch);
- a radius of curvature R1 of about 0.015 inch (with a tolerance of about +/−0.005 inch);
- a radius of curvature R2 of about 0.015 inch (with a tolerance of about +/−0.005 inch);
- a radius of curvature R3 of about 0.015 inch (with a tolerance of about +/−0.005 inch);
- a radius of curvature R4 of about 0.015 inch (with a tolerance of about +/−0.005 inch);
- a radius of curvature R5 of about 0.065 inch (with a tolerance of about +/−0.005 inch);
- a radius of curvature R6 of about 0.065 inch (with a tolerance of about +/−0.005 inch);
- a radius of curvature R7 of about 0.567 inch (with a tolerance of about +/−0.100 inch);
- a radius of curvature R8 of about 0.567 inch (with a tolerance of about +/−0.100 inch);
- a radius of curvature R9 of about 0.065 inch (with a tolerance of about +/−0.005 inch);
- a radius of curvature R10 of about 0.065 inch (with a tolerance of about +/−0.005 inch);
- an angle A1 of about 92.3 degrees (with a tolerance of about +/−3 degrees);
- an angle A2 of about 92.3 degrees (with a tolerance of about +/−3 degrees);
- an angle A3 of about 69.4 degrees (with a tolerance of about +/−3 degrees);
- an angle A4 of about 69.4 degrees (with a tolerance of about +/−3 degrees); and
- a cross-sectional area of about 0.05 square inches.

Figure 12:
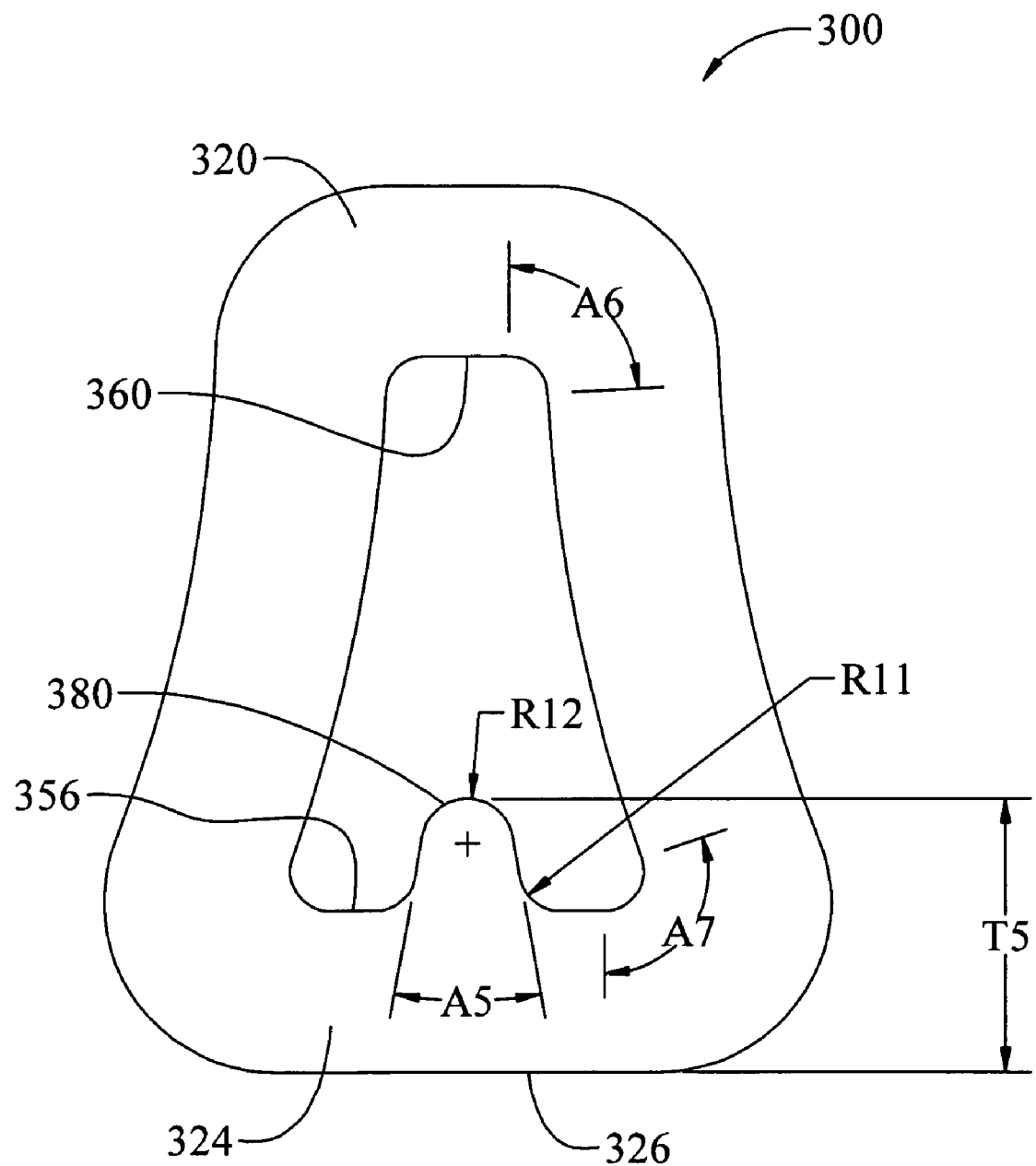
FIG. 12 is a perspective end view of another EMI shielding and/or environmental sealing gasket according to exemplary embodiments.

FIG. 12 illustrates an alternative embodiment of a gasket 300. In this particular embodiment, the gasket 300 includes a protruding portion or bearing member 380. The protruding portion 380 extends generally from the inner surface 356 of the base member 324, and towards the inner surface 360 of the top member 320. Advantageously, the protruding portion 380 may be configured to contact the inner surface 360 of the top member 320, at the low end of compression in order to prevent or at least inhibit the base member's outer surface 326 from arcing up and/or pealing away from a substrate surface. Alternative embodiments may include one or more protruding portions extending from the inner surface of the top member instead of, or in addition, to one or more protruding portions extending from the inner surface of the base member.

In some embodiments, one or both of the inner surfaces of the top member and the base member may be configured as having an area of enlarged wall thickness that defines a protruding portion or bearing member. The bearing member may extend axially along at least a portion of the length of the gasket, and extend inwardly from the corresponding inner surface to a distal end disposable in the gasket's collapsed orientation in an abutting, force transferring relationship with the other one of the inner surfaces.

With continued reference to FIG. 12, exemplary dimensions will now be provided for one particular embodiment when the gasket 300 is uncompressed or free-standing. These dimensions are provided (as are all dimensions disclosed herein) as mere examples for purposes of illustration only. In other embodiments, a gasket can be configured with different dimensions depending, for example, on the particular location at which the gasket is to be used, space considerations, compression requirements, EMI shielding requirements, environmental sealing requirements, differential pressure sealing requirements, combinations thereof, etc.

Continuing with the exemplary embodiment shown in FIG. 12 the gasket 300 may be configured with the same or similar dimensions as gasket 100 or 200. Alternatively, the gasket 300 may be configured with different dimensions. For example, the gasket 300 may topologically be substantially similar proportionally to gasket 100 or 200, but gasket 300 may be larger or smaller in scale.

In addition, one particular embodiment of the gasket 300 has the following dimensions:
- a thickness T5 of about 0.105 inch (with a tolerance of about +/−0.010 inch); a
- a radius of curvature R11 of about 0.015 inch (with a tolerance of about +/−0.005 inch);
- a radius of curvature R12 of about 0.018 inch (with a tolerance of about +/−0.005 inch);
- an angle A5 of about 20.0 degrees (with a tolerance of about +/−3 degrees);
- an angle A6 of about 87.0 degrees (with a tolerance of about +/−3 degrees); and
- an angle A5 of about 109.0 degrees (with a tolerance of about +/−3 degrees).

Figure 13:
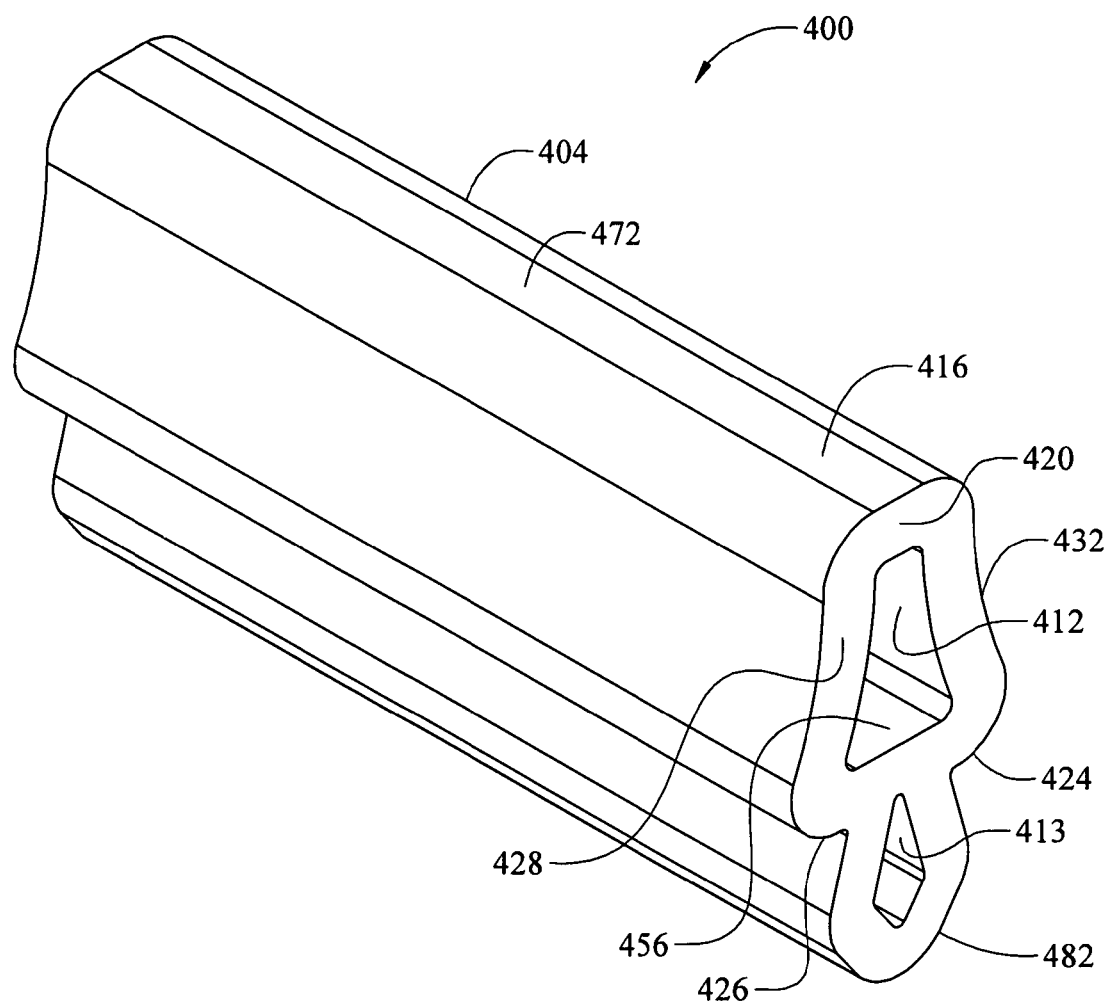
FIG. 13 is a perspective end view of another EMI shielding and/or environmental sealing gasket according to exemplary embodiments.
Figure 14:
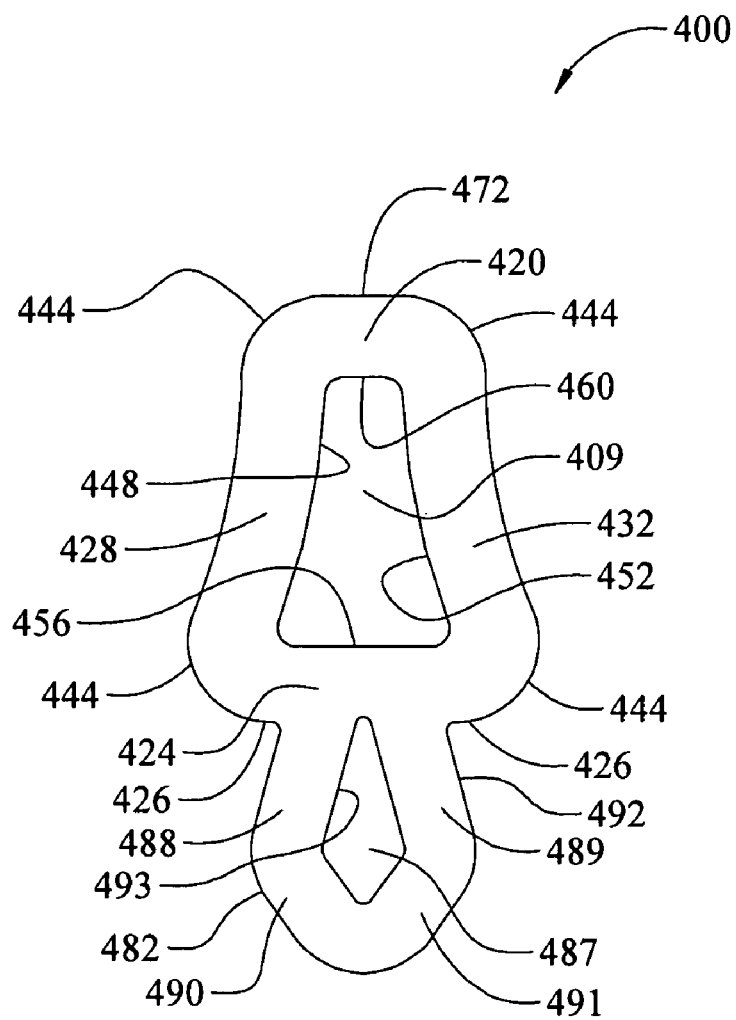
FIG. 14 is an end elevation view of the gasket profile shown in FIG. 13.

FIGS. 13 and 14 illustrate an alternative embodiment of a gasket 400. In this particular embodiment, the gasket 400 includes a slot-mounting feature in the form of a bulb or portion 482 extending generally downwardly from the lower member 424. The portion 482 is configured to be engagingly received within a groove or slot for slot mounting the gasket 400 to the surface defining the slot of groove. For example, the portion 482 may be resiliently compressible for forming an interference or friction fit with the sidewalls defining the slot or groove. The portion 482 is configured for groove or slot mounting the gasket 400. For example, the portion 482 may be configured to be engagingly received within a groove or slot for slot mounting the gasket 400 to the surface defining the slot of groove. In some embodiments, the portion 482 may be resiliently compressible for forming an interference or friction fit with the sidewalls defining the slot or groove. In some embodiments, groove mounting the gasket 400 may provide for an easier and faster accurate assembly by eliminating the need for a primer and adhesive. Groove mounting may also allow for better shear resistance and easier removal for replacement.

Figure 15:
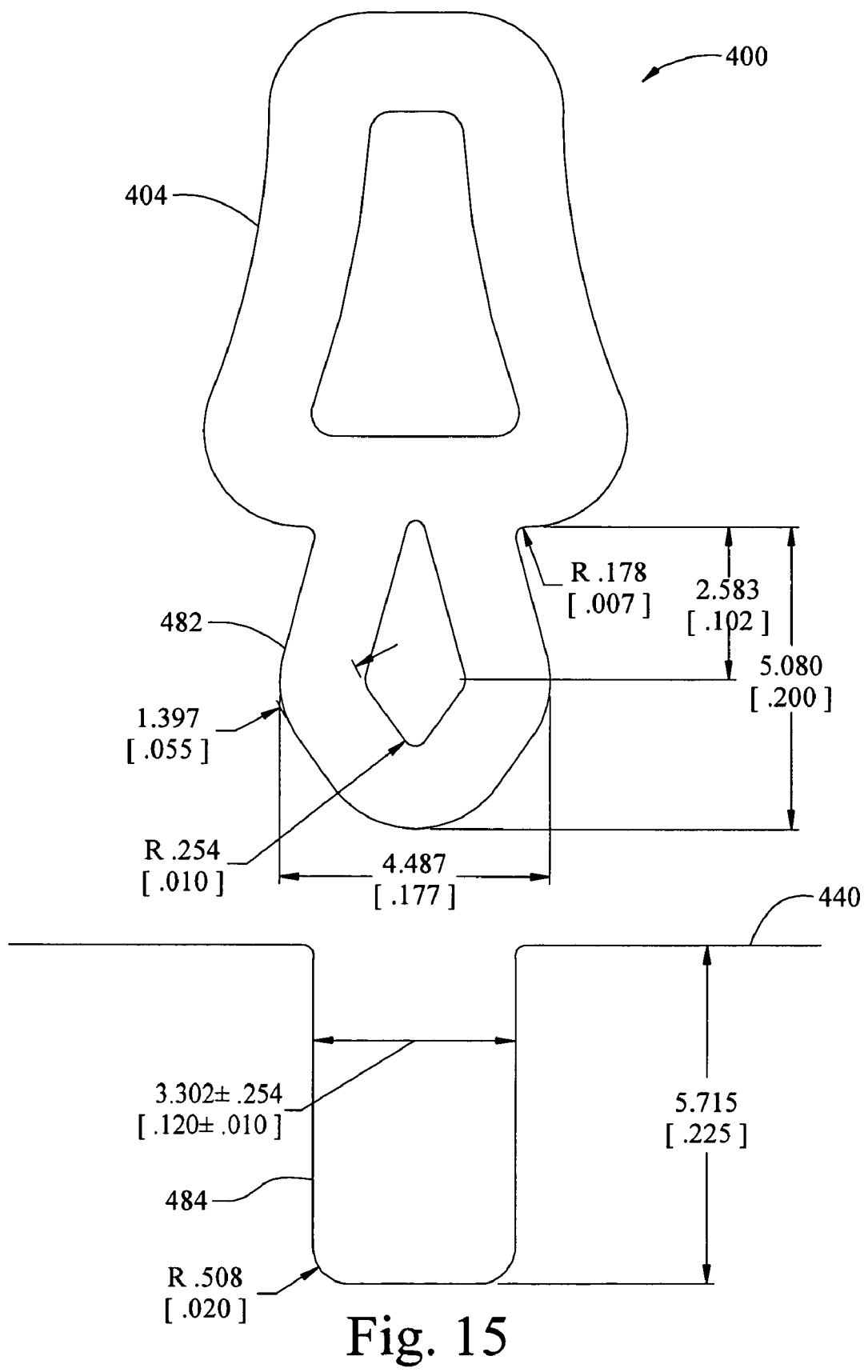
FIG. 15 is an end elevation view of the gasket profile shown in FIG. 13 aligned for mounting in a rectangular slot or groove with exemplary dimensional parameters provided in millimeters (inches are shown in brackets) for purposes of illustration only according to exemplary embodiments.
Figure 16:
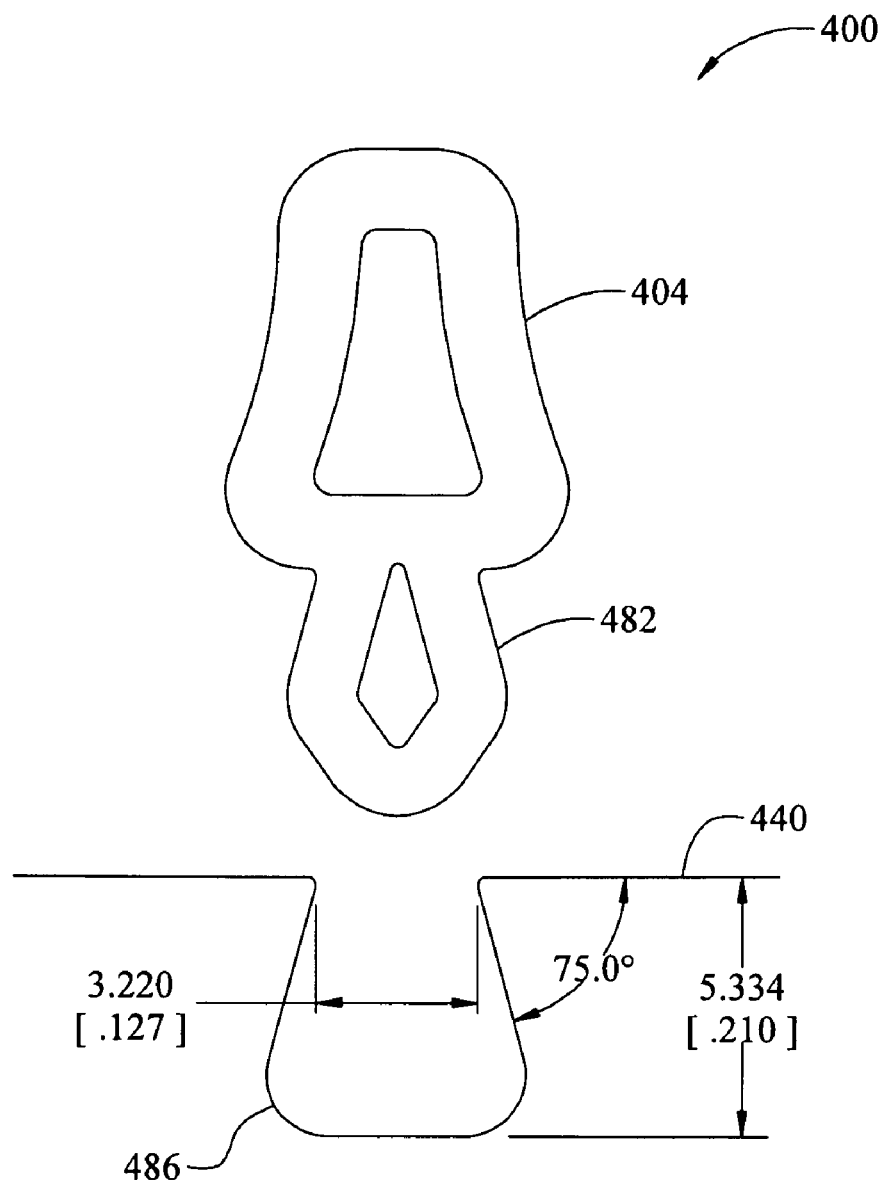
FIG. 16 is an end elevation view of the gasket profile shown in FIG. 13 aligned for mounting in a dovetail slot or groove with exemplary dimensional parameters provided in millimeters (inches are shown in brackets) for purposes of illustration only according to exemplary embodiments.

By way of example, FIG. 15 illustrates the gasket 400 aligned for mounting in a rectangular groove or slot 484. FIG. 16 illustrates the gasket 400 aligned for mounting in a dovetail groove or slot 486. FIGS. 15 and 16 provide exemplary dimensional parameters in millimeters (inches are shown in brackets) for the slot-mounting feature 482 and slots 484, 486. These dimensions are provided (as are all dimensions disclosed herein) as mere examples for purposes of illustration only. In alternative embodiments, the gasket 400 may be mounted to a surface by positioning the bulb or portion 482 into a rectangular slot or groove having a width from about 0.125 inch to about 0.140 inch and a depth of about 0.225 inch or more. Alternative embodiments may include a differently configured portion 482 for mounting in a slot with a different configuration (e.g., differently shaped sized, different location, etc.). In addition, the upper portion of the gasket 400 including the upper and lower members 420, 424 and lateral members 428, 432 may be dimensionally sized and configured substantially similar to or identical to the members 220, 224, 228, 232 of gasket 200 as disclosed above and shown in FIG. 11. In other embodiments, a gasket may be configured with different dimensions and/or shaped differently depending, for example, on the particular location at which the gasket is to be used, space considerations, compression requirements, EMI shielding requirements, environmental sealing requirements, differential pressure sealing requirements, combinations thereof, etc.

The gasket's portion 482 may be integrally formed along with the gasket's body 404. For example, the body 404 and portion 482 may be integrally formed as an extrusion of elastomer material. In various embodiments, a gasket may be formed by extruding an electrically-conductive elastomer material, such as silicone or fluorosilicone rubber rendered electrically-conductive by its loading with a silver-based filler and/or a nickel-based filler. By way of example, a gasket may be formed from Electrically-Conductive Elastomer 92 (ECE92)—Fluorosilicone with Nickel/Carbon Filler. As another example, a gasket may be formed from electrically-conductive elastomer 95 (ECE95), which comprises EPDM rubber (ethylene propylene diene M-class rubber) with Nickel/Carbon filler. Alternatively, a wide range of other materials and filler particles (e.g., silver plated aluminum, tungsten carbide coated aluminum, stainless steel, aluminum oxide, and Iron Silicide (80% Iron, 20% Silicon), etc.) may also be used for any of the gaskets disclosed herein, including dielectric elastomeric materials. Likewise, other manufacturing processes besides extrusion can also be employed, such as molding, die-cutting, etc. In this regard, die-cutting may involve forming the gasket from a cured sheet of an electrically-conductive elastomer, which is cut or stamped using a die or the like into the desired configuration. Molding, in turn, may involve the compression, transfer, or injection molding of an uncured or thermoplastic elastomer into the desired configuration. The materials and manufacturing processes described herein are illustrative only, as gaskets may be formed from different materials and/or by different manufacturing processes.

Figure 22:
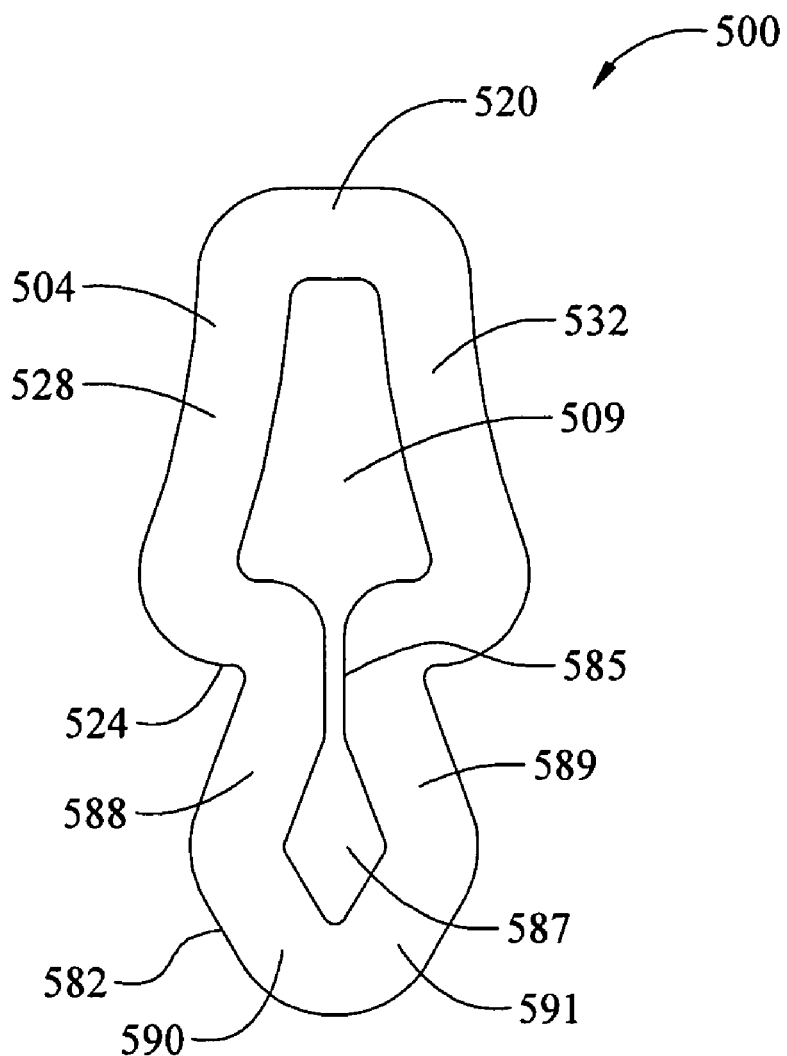
FIG. 22 is an end elevation view of the gasket profile shown in FIG. 21.

With continued reference to FIGS. 13 and 14, the upper portion of the gasket body 404 has a closed generally trapezoidal cross-sectional geometry that defines a generally trapezoidal opening 409. The lower portion 482 has a closed generally diamond shaped cross-sectional geometry that defines a generally diamond-shaped opening 487. In this illustrated embodiment, the openings 409 and 487 are spaced apart and separated from each other by the gasket's lower member 424. Alternatively, other embodiments may include a gasket body with an upper and/or lower portion or opening(s) with different cross sectional shapes. For example, FIG. 22 illustrates an alternative embodiment of a gasket 500 that includes openings 509 and 587 with an opening 585 extending therebetween.

With continued reference to FIG. 13, the body 404 of the gasket 500 has interior and exterior surfaces 412, 416 defining wall thicknesses therebetween for the upper portion. The body 404 also includes an interior surface 413 that cooperates with the exterior surface 416 to define wall thicknesses therebetween for the lower portion 482. In an exemplary embodiment of the gasket 400, the upper member 420 has a wall thickness of about 0.065 inch, the lower or base member 424 has a wall thickness of about 0.060 inch, and the portion 482 has a wall thickness of about 0.055 inch. In another example embodiment of the gasket 400, the wall thicknesses of the gasket 400 may be about 0.058 inch (with a tolerance of about +/−0.005 inch) for the wall thickness of the upper member 420, about 0.055 inch (with a tolerance of about +/−0.005 inch) for the wall thickness of the lower member 424, and about 0.058 inch (with a tolerance of about +/−0.005 inch) for the wall thickness of each lateral member 428, 432. Advantageously, some embodiments provide the upper member with a wall thickness greater than the wall thickness of the lower member in order to minimize (or at least reduce) the compressive force at the lower gap sizes (e.g., 0.134 inch gap, etc.) by delaying the abutting contact of the upper and lower inner surface portions of the first and second lateral member 428, 432 as the gasket 400 is being compressed, thus extending the deflection range over which the gasket force remains relatively constant. Alternatively, other wall thickness may be employed, and some embodiments may include a gasket having a generally uniform wall thickness completely therearound for ease of manufacturing.

With continued reference to FIGS. 13 and 14, the gasket's first and second lateral members 428, 432, and upper and lower members 420, 424 cooperatively define an approximately trapezoidal gasket profile. As shown in FIG. 14, the lower member 424 is wider than the upper member 420. The first and second lateral members 428 and 432 are bowed, arced, or curved slightly inwardly relative to each other.

The gasket 400 may be configured for interposition between first and second surfaces (e.g., surfaces 436, 440 as shown in FIG. 17, etc.). In some preferred embodiments, the base or lower member 424 is configured such that its outer surface portions 426 will conform to a second surface, while the outer surface 472 of the upper member 420 is generally parallel with an upper surface. In the embodiment illustrated in FIGS. 13 and 14, the upper and lower members 420, 424 are generally parallel to each other. In addition, the outer surface portions 426 of the base member 424 are shown generally flat. Likewise, the outer surface 472 of the top member 424 is also show generally flat. In other embodiments, either or both of these outer surfaces may be configured differently depending, for example, on the particular application. For example, some embodiments may have the gasket's upper and/or lower member being bowed, arced, or curved slightly inwardly.

The lateral members 428, 432 are connected to the upper and lower members 420, 424 such that the gasket 400 includes four generally rounded or curved corner portions or intersections 444. The lateral members 428, 432 extend from the upper member 420 to intersect the lower member 424. The lateral members 428, 432 convexly curve or bow generally inwardly towards each other.

In some preferred embodiments, an acute angle is defined generally between the inner surface 448, 452 of each lateral member 428, 432 and the inner surface 456 of the lower member 424. Alternative embodiments, however, may include an obtuse angle or a right angle defined generally between the inner surface 448, 452 of each lateral member 428, 432 and the inner surface 456 of the base member 424. In addition, some embodiments are configured such that the angles defined generally between the inner surface 448, 452 of each lateral member 428, 432 and the inner surface 456 of the base member 424 are not the same size.

In some preferred embodiments, an obtuse angle is defined generally between the inner surface 448, 452 of each lateral member 428, 432 and the inner surface 460 of the upper member 420. Alternative embodiments, however, may include an obtuse angle or a right angle defined generally between the inner surface 448, 452 of each lateral member 428, 432 and the inner surface 460 of the upper member 420. In addition, some embodiments are configured such that the angles defined generally between the inner surface 448, 452 of each lateral member 428, 432 and the inner surface 460 of the upper member 420 are not the same size.

With continued reference to FIG. 13, the body 404 is shown having indefinite length. The gasket 400, however, may be cut, sectioned, or otherwise terminated for a custom fit at a particular location. In other words, the length of the gasket 400 can vary depending on the intended use of the gasket 400. The gasket 400 can be provided with a relative straight gasket length (FIG. 13), or the gasket 400 may be provided with a curved gasket length (e.g., gasket 400' in FIG. 20, etc.). Alternative embodiments include gaskets having various lengths, curvatures, etc. depending, for example, on the particular location and gap in which the gasket will be installed.

As shown in FIG. 14, the bulb or bottom portion 482 includes four members 488, 489, 490, and 491 that cooperatively define a generally diamond shaped cross-sectional geometry and a generally diamond shaped opening 487. The members 488 and 489 are connected to the lower member 424 such that an acute angle is defined generally between the outer surface 492 of each lateral member 488 and 489 and the corresponding outer surface portion 426 of the lower member 424. Alternative embodiments, however, may include an obtuse angle or a right angle defined generally between the outer surfaces 492 of each lateral member 488, 489 and the corresponding outer surface portion 426 of the lower member 424. In addition, some embodiments are configured such that the angles defined generally between the outer surfaces 492 of each lateral member 488, 489 and the corresponding outer surface portion 426 of the lower member 424 are not the same size.

In some preferred embodiments, an obtuse angle is defined generally between the inner surfaces 493 of the members 488 and 490 and between the inner surfaces 493 of the members 489 and 491. Alternative embodiments, however, may include an acute angle or a right angle instead of an obtuse angle. In addition, some embodiments are configured such that the angle defined generally between the inner surfaces 493 of the members 488 and 490 is different than the angle defined between the inner surfaces 493 of the members 489 and 491.

In order to further illustrate various aspects of the present disclosure and possible advantages thereof, the following non-limiting modeling and test results are given for the gasket 400 for purposes of illustration. This modeling behavior and test results are provided to help illustrate various aspects of the gasket embodiments disclosed herein.

FIGS. 17A through 17D are graphical illustrations of a finite element model showing, in cross-section, deformation at various stages as the gasket 400 is compressed between generally parallel and opposite substrate surfaces 436 and 440 with the gasket portion 482 compressively mounted within a rectangular slot 484. For this particular modeling example, the gasket 400 is being compressed by the upper substrate surface 436 engaging the gasket's upper member 420 with zero shear motion.

Figure 17A:
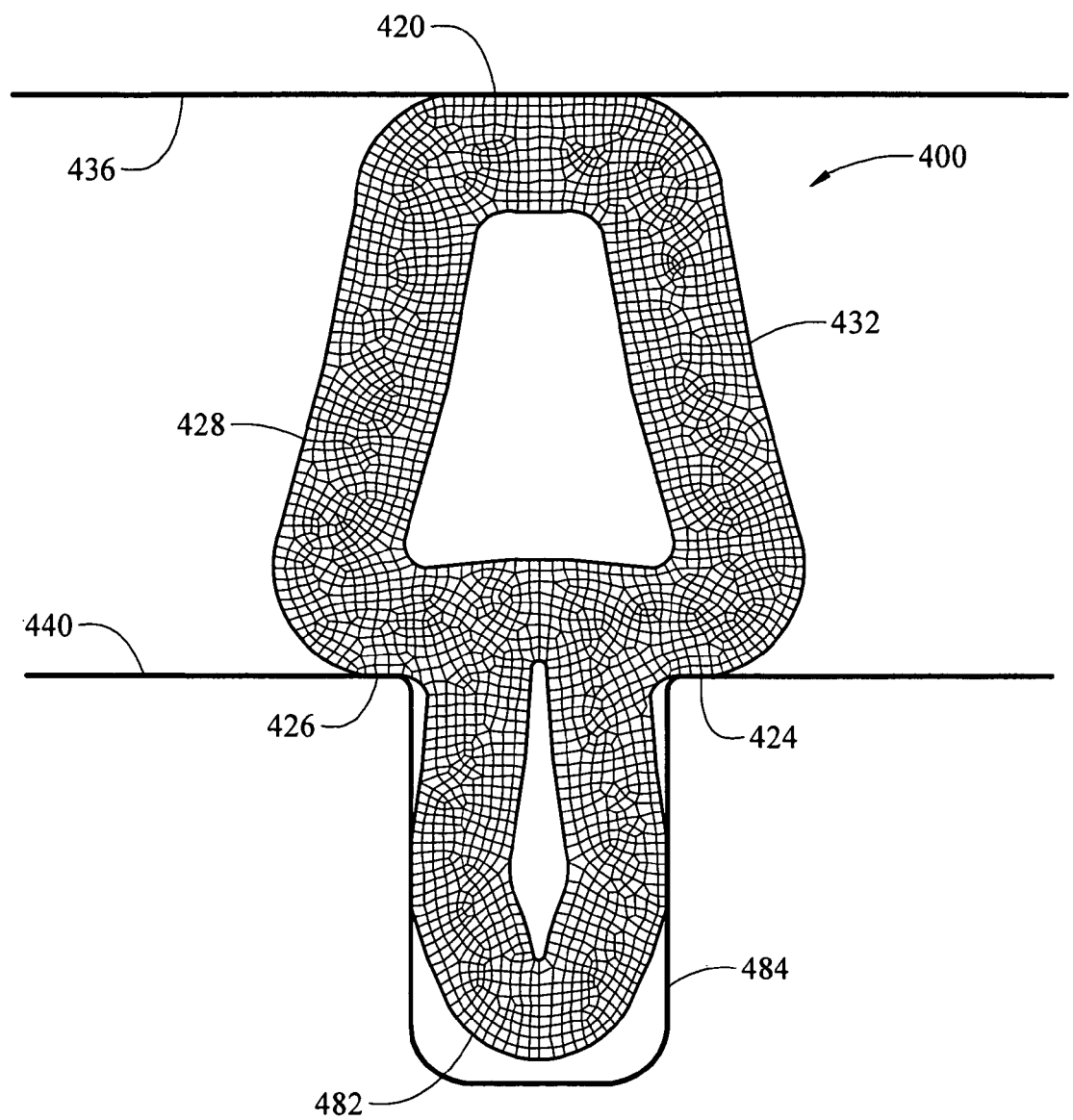
FIGS. 17A through 17D are graphical representations of a finite element model showing, in cross-section, deformation at various stages of the gasket shown in FIG. 13 when mounted in a rectangular slot/groove and being compressed between generally parallel and opposite substrate surfaces.
Figure 17B:
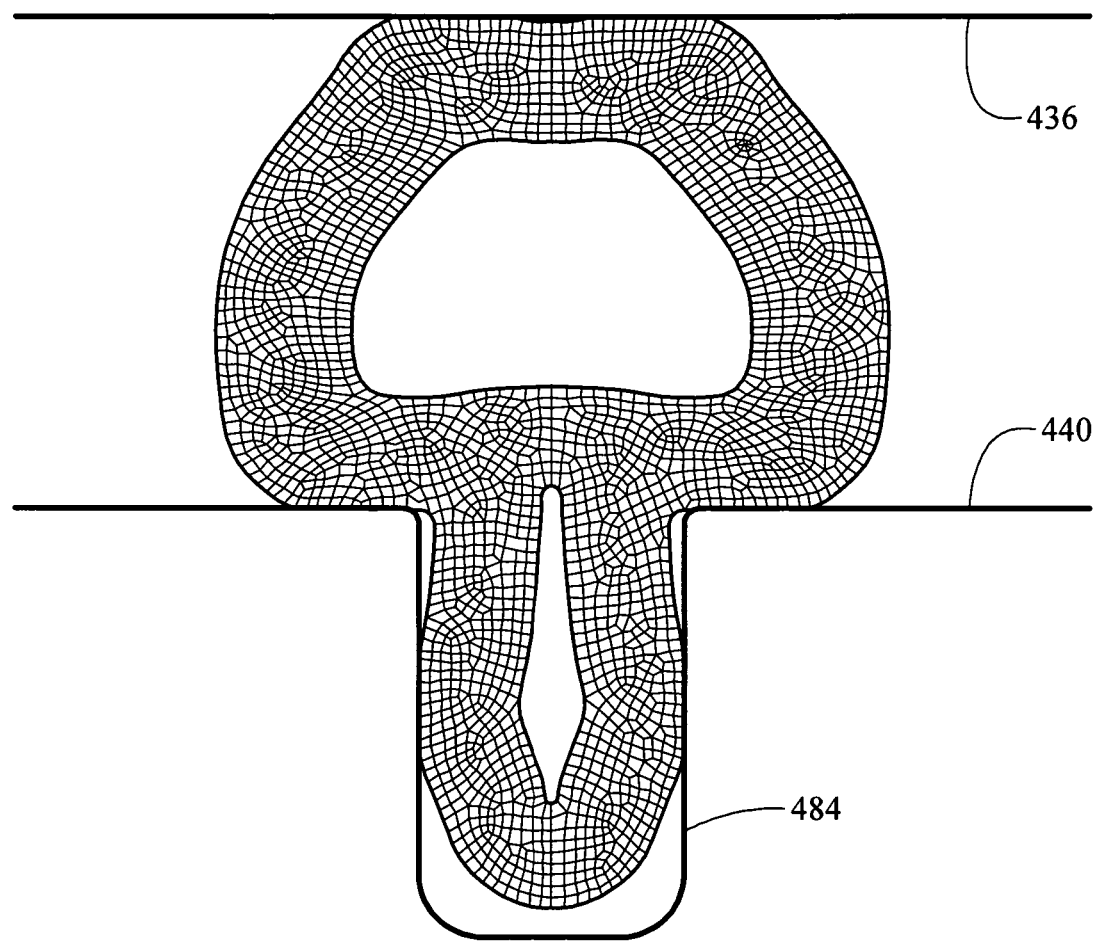
Figure 17C:
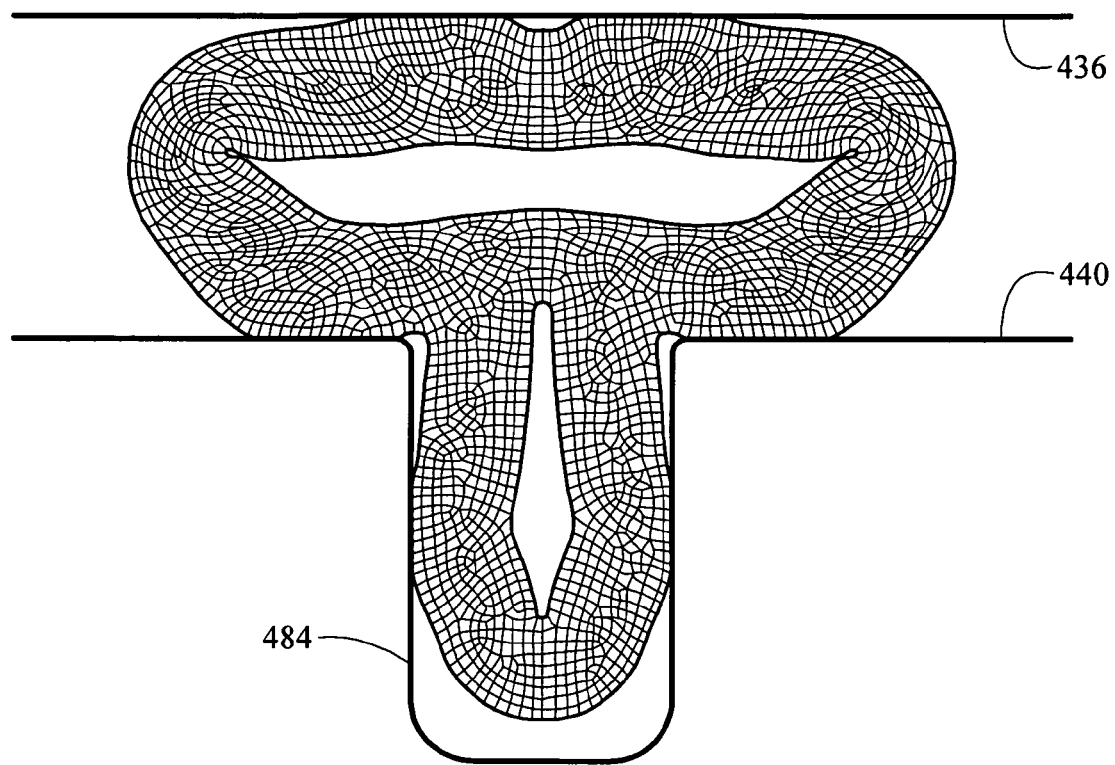
Figure 17D:
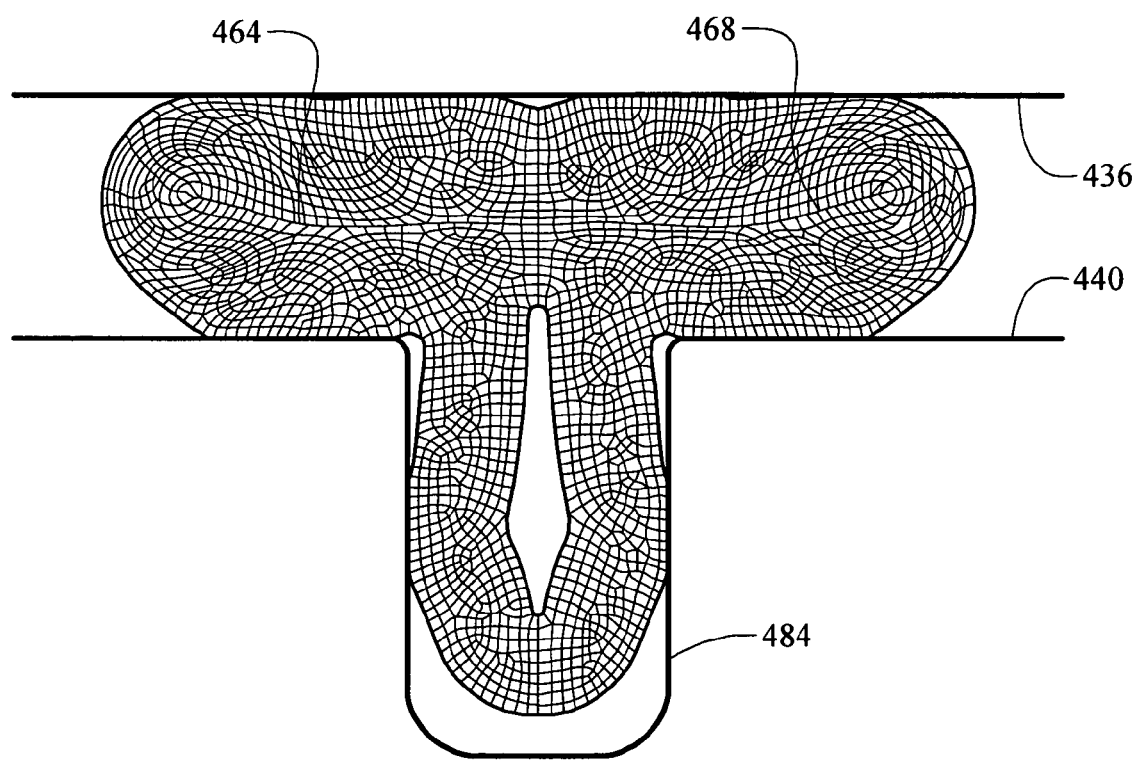

Generally, FIGS. 17A through 17D show the gasket 400 at various in compression stages. FIG. 17D shows the gasket 400 at a collapsed orientation as compressed between the substrate surfaces 436 and 440 at a predetermined gap of 0.134 inch, resulting in a compressive force of about twenty pounds per inch of gasket length.

In these FIGS. 17A through 17D, the gasket 400 was modeled without any adhesive bonding the outer surface portions 426 of the gasket's base member 424 to the lower substrate surface 440. Instead, the gasket 400 was modeled as being slot mounted with the bulb portion 482 in the rectangular slot 484. It was also assumed that the upper and lower substrate surfaces 436 and 440 were perfectly rigid. It was further assumed that the gasket 400 was softened or conditioned after repeated compression a few times, but has not taken any permanent reduction in free height as a result. Other assumptions included that no gasket strain occurs along the length of the gasket, such that the analysis disregarded the tendency of gasket length to increase during compression and the complex deformation behavior that typically occurs at vulcanized miter joints or along curved gasket paths. The friction coefficient between all surfaces was assumed to be 0.6.

Looking initially to FIG. 17A, the gasket 400 has a generally trapezoidal profile. This generally trapezoidal profile is collectively defined by the gasket's upper member 420, lower member 424, and lateral members 428, 432. FIGS. 17B and 17C show the manner in which the lateral members 428, 432 change configuration as the gasket 400 is being compressed between the substrate surfaces 436 and 440. The lateral members 428, 432 initially have a generally convex curvature relative to each other, as shown in FIG. 17A. But as the gasket 400 compresses, medial portions of the lateral members 428, 432 move or bow outwardly away from each other. This, in turn, helps minimize (or at least reduce) increases in gasket force by forcing the lateral members 428, 432 to carry more of the force in bending and less in axial compression.

Ultimately, the gasket 400 when sufficiently compressed will transform into the collapsed orientation shown in FIG. 17D. This collapsed orientation is characterized in that upper and lower inner surface portions of the first lateral member 428 are in an abutting, force transferring relationship with each other (as generally designated by reference number 464), and upper and lower inner surface portions of the second lateral member 432 are in an abutting, force transferring relationship with each other (as generally designated by reference number 468). Also shown in FIG. 17D, outer surface portions of the respective lateral members 428, 432 are in contact with the upper substrate surface 436.

Figure 18:
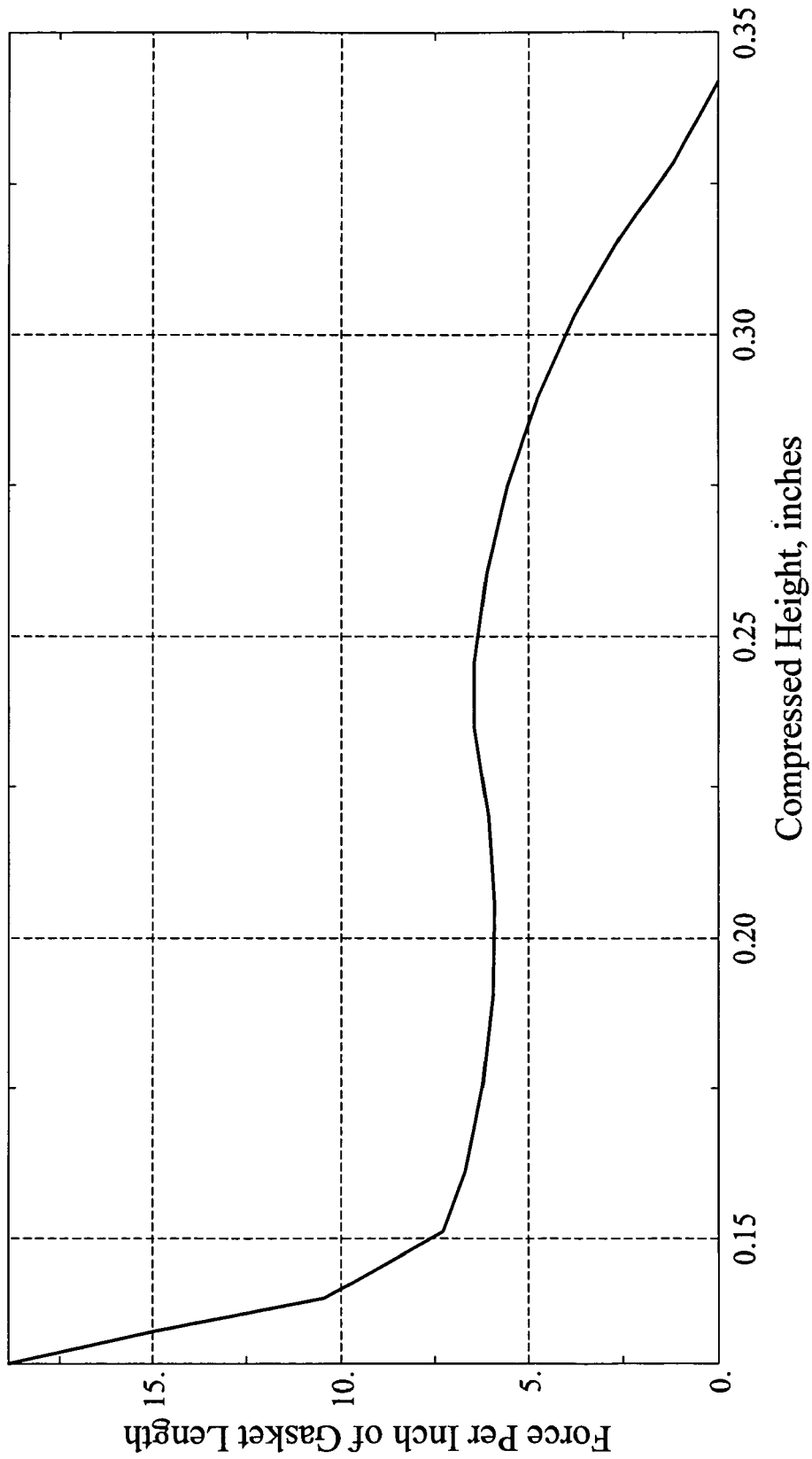
FIG. 18 is an exemplary line graph of force versus deflection behavior (generated from a finite element analysis simulation) showing gasket force per inch of gasket length for the relatively straight gasket length shown in FIG. 13 when mounted in 0.125 inch wide rectangular slot or groove.

FIG. 18 is an exemplary line graph of gasket force per inch of gasket length versus compression height or gap size for the relatively straight gasket length shown in FIG. 13. As can be seen in FIG. 18, the gasket force remains relatively constant over a fairly large deflection range. Accordingly, the gasket force per inch of gasket length over a predetermined compression range has a general shape characterized by three slope regions, including a fairly quick ramp-up to functional force starting from the free height of the gasket, followed by relatively constant force over a large compression range (e.g., approximately one-third of the free gasket height or about 0.280 inch gap down to about 0.165 inch gap), and then followed by an inevitable and relatively quick ramp-up in force as the gasket begins abutting itself (e.g., as shown by areas 464 and 468 in FIG. 17, etc.). In some preferred embodiments, the gasket is configured such that the gasket force per inch length does not change by more than about sixty percent for a range of compression from a gap of about eighty-two percent of the free gasket height (e.g., gasket free standing height of 0.340 inch or 0.170 inch; 0.280 inch gap in some embodiments, etc.) down to a gap of about forty-nine percent of the free gasket height (e.g., 0.165 inch gap in some embodiments, etc.). In addition, some embodiments include a gasket configured such that the gasket exhibits a force at a gap of 0.165 inch that is about fifty percent higher than the force at a 0.280 gap. IN some embodiments, the gasket may have a free standing height of 0.340 inch, 0.170 inch, etc. In embodiments in which the gasket has a free standing height of 0.170 inch, the other dimensions of the gasket may be scaled proportionately downward from what is described above and shown in FIG. 11, etc.

FIGS. 19A through 19D are graphical illustrations of a finite element model showing, in cross-section, predicted strain distributions for various stages as the gasket 400 is compressed between generally parallel and opposite substrate surfaces 436 and 440 with the gasket portion 482 compressively mounted within a dovetail slot 486. For this particular modeling example, the gasket 400 is again being compressed by the upper substrate surface 436 engaging the gasket's upper member 420 with zero shear motion.

Figure 19A:
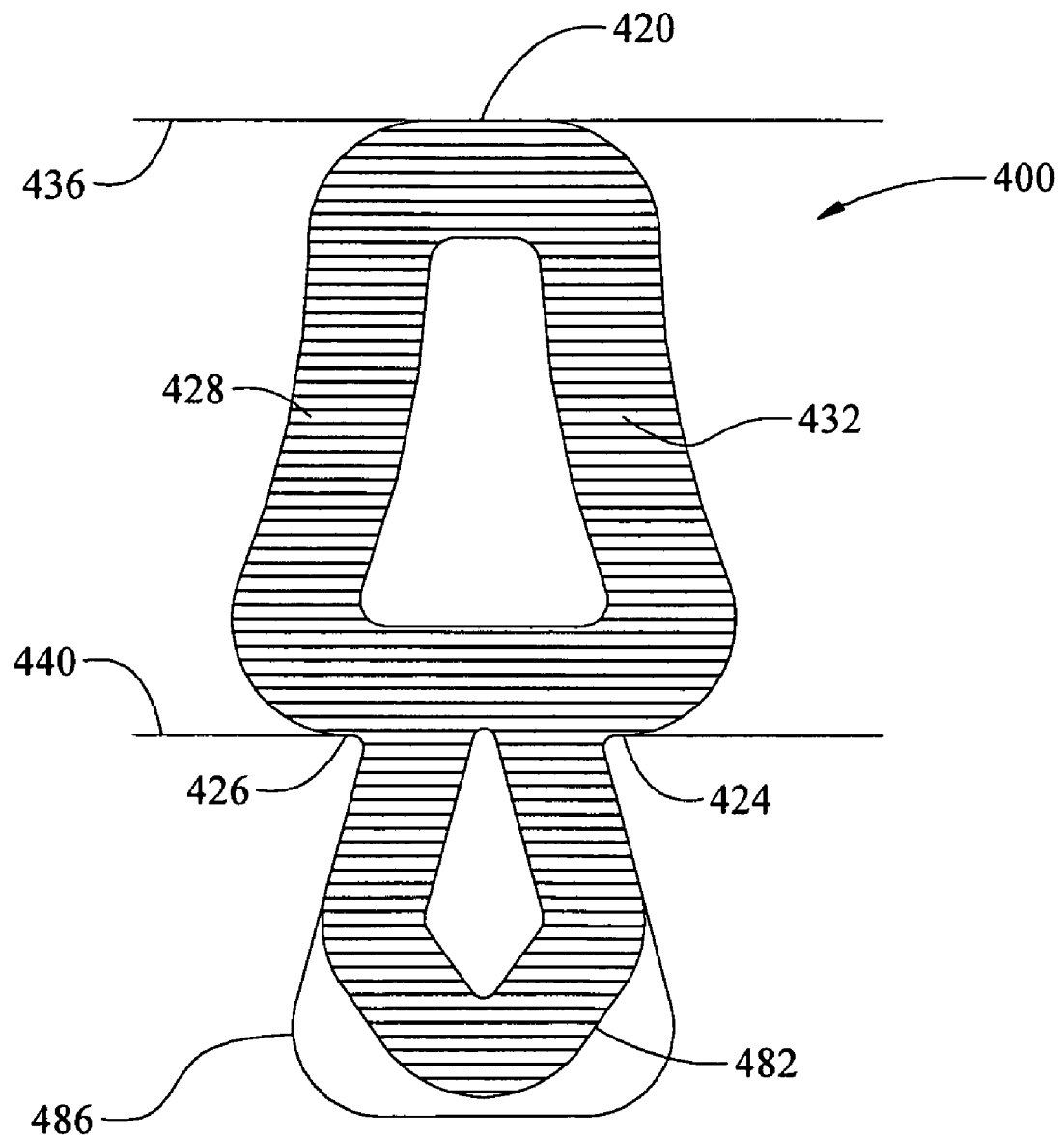
FIGS. 19A through 19D are graphical representations of a finite element model showing, in cross-section, predicted strain distributions for various stages of the gasket shown in FIG. 13 when mounted in a dovetail slot/groove and being compressed between generally parallel and opposite substrate surfaces.
Figure 19B:
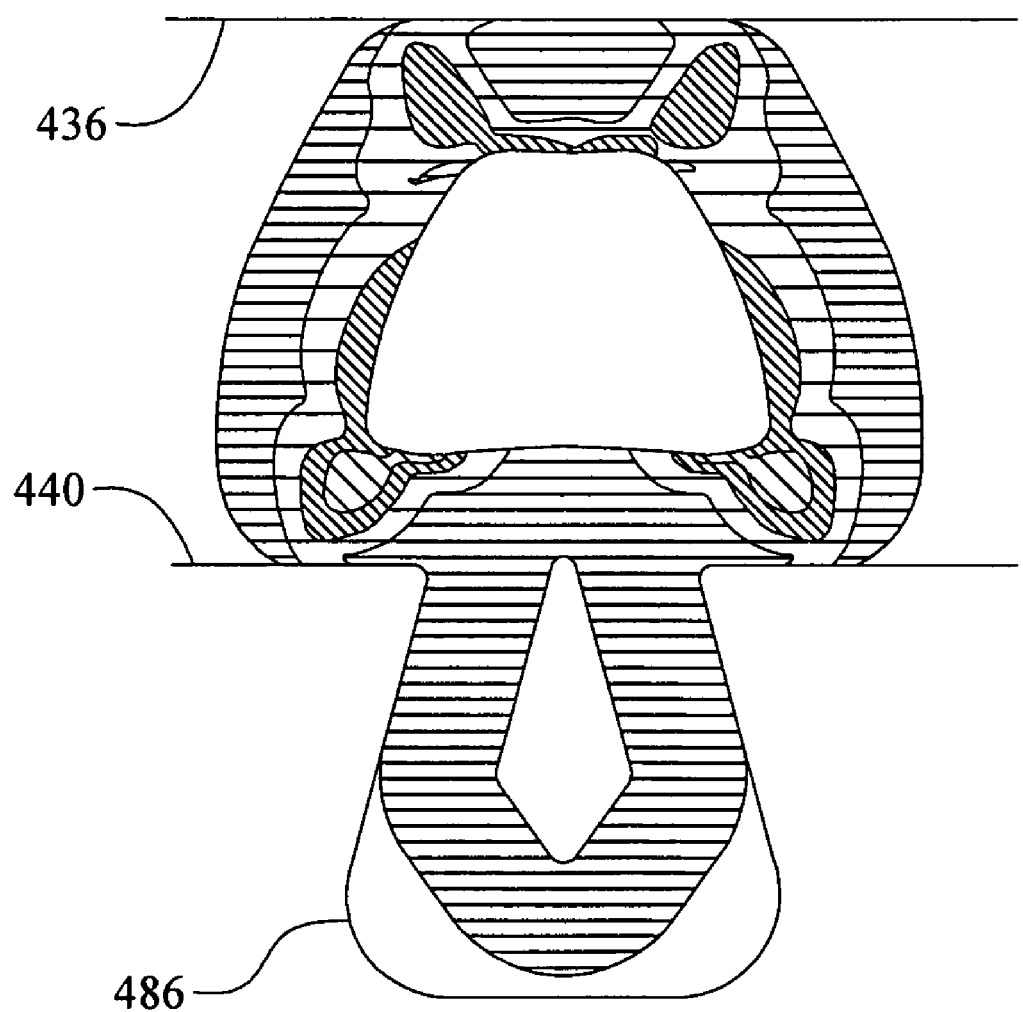
Figure 19C:
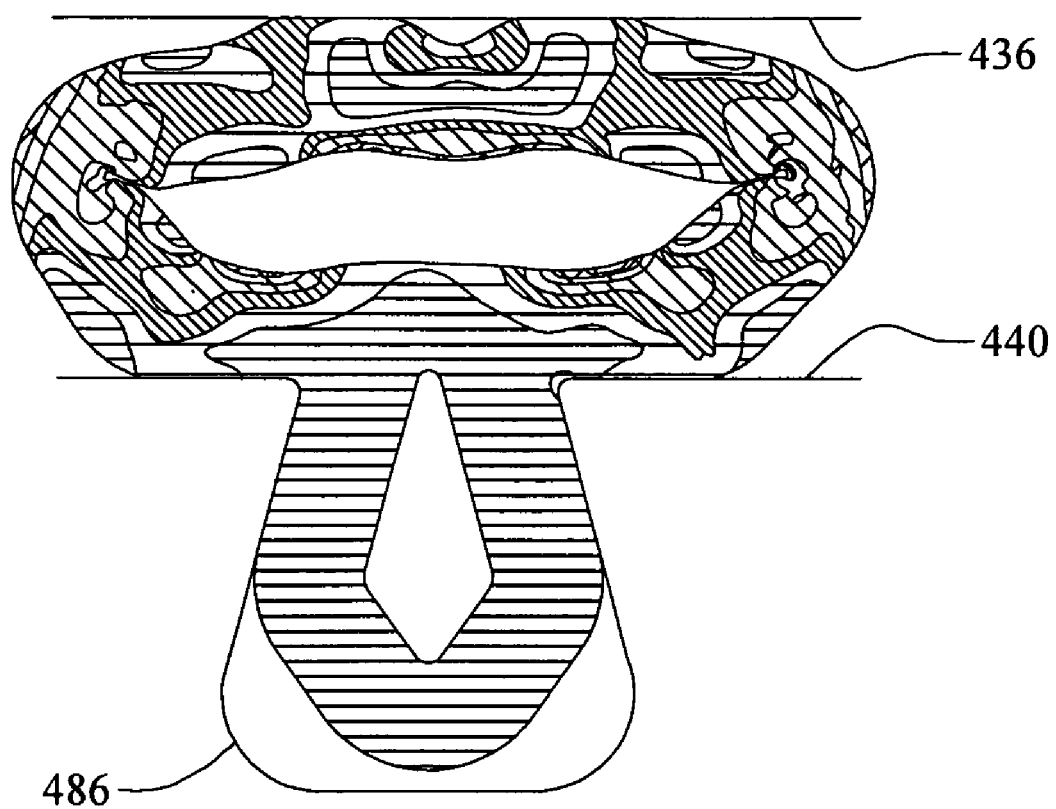
Figure 19D:
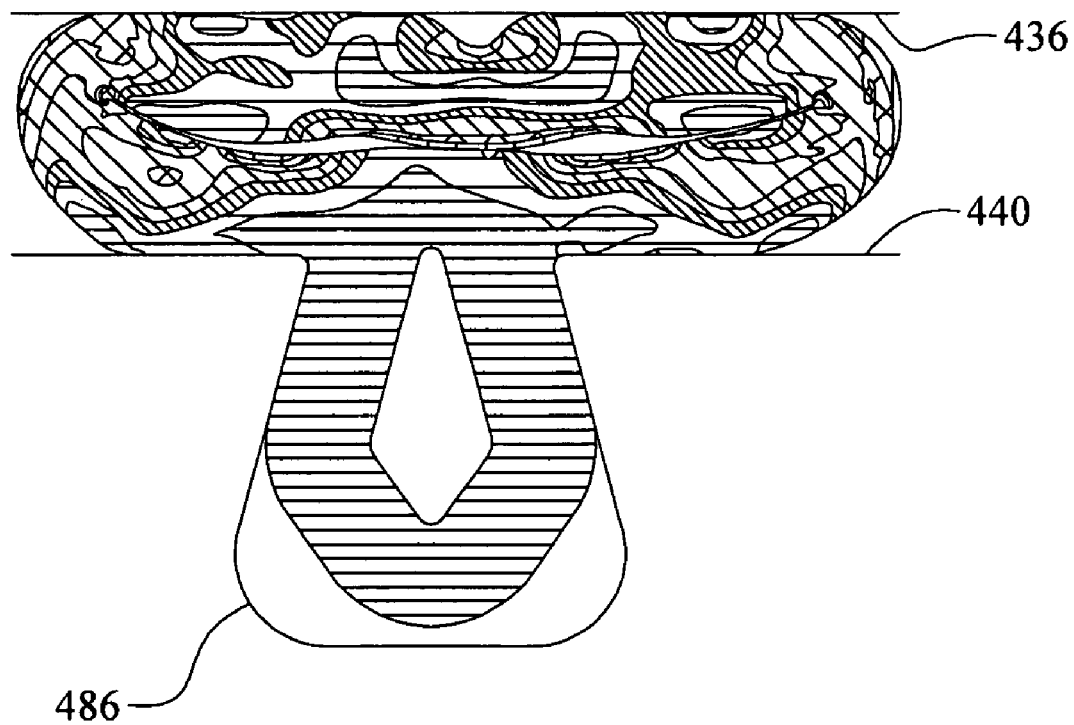

Generally, FIGS. 19A through 19D show the gasket 400 at various in compression stages. FIG. 19D shows the gasket 400 at a collapsed orientation as compressed between the substrate surfaces 436 and 440 at a predetermined gap of 0.134 inch, resulting in a compressive force of about twenty pounds per inch of gasket length.

In these FIGS. 19A through 19D, the gasket 400 was modeled with the gasket's portion 482 bonded (e.g., with adhesive, etc.) to the dovetail slot 486. It was also assumed that the upper and lower substrate surfaces 436 and 440 were perfectly rigid. It was further assumed that the gasket 400 was softened or conditioned after repeated compression a few times, but has not taken any permanent reduction in free height as a result. Other assumptions included that no gasket strain occurs along the length of the gasket, such that the analysis disregarded the tendency of gasket length to increase during compression and the complex deformation behavior that typically occurs at vulcanized miter joints or along curved gasket paths. The friction coefficient between all surfaces was assumed to be 0.6.

Looking initially to FIG. 19A, the gasket 400 has a generally trapezoidal profile. This generally trapezoidal profile is collectively defined by the gasket's upper member 420, lower member 424, and lateral members 428, 432. FIGS. 19B and 19C show the manner in which the lateral members 428, 432 change configuration as the gasket 400 is being compressed between the substrate surfaces 436 and 440. The lateral members 428, 432 initially have a generally convex curvature relative to each other, as shown in FIG. 19A. But as the gasket 400 compresses, medial portions of the lateral members 428, 432 move or bow outwardly away from each other. This, in turn, helps minimize (or at least reduce) increases in gasket force by forcing the lateral members 428, 432 to carry more of the force in bending and less in axial compression.

Ultimately, the gasket 400 when sufficiently compressed will transform into the collapsed orientation shown in FIG. 19D. This collapsed orientation is characterized in that upper and lower inner surface portions of the first lateral member 428 are in an abutting, force transferring relationship with each other, and upper and lower inner surface portions of the second lateral member 432 are in an abutting, force transferring relationship with each other. Also shown in FIG. 19D, outer surface portions of the respective lateral members 428, 432 are in contact with the upper substrate surface 436.

These aspects and features relating to constancy of gasket force over a large range of compression is what helps allow various embodiments of the gasket 400 to be able to seal against an air pressure differential of, for example, at least about 6.4 pounds per square inch when the gasket is compressed to a gap size between about 0.295 inch to about 0.185 inch, and also to seal against an air pressure differential of, for example, at least about 8.6 pounds per square inch without exceeding a gasket force of about thirty-two pounds per inch of gasket length when the gasket is compressed to a gap size between about 0.185 inch to about 0.134 inch. In cases where the sealing of a pressure differential is not required or necessary, the constancy of gasket force over a relatively large deflection range can also provide a reliable seal against the transfer of such materials as driven rain, dust, pooled liquids, gases, etc., especially in situations where gasket gap cannot be precisely controlled, and without overstressing assembly components or making it hard to close doors, etc.

Figure 21:
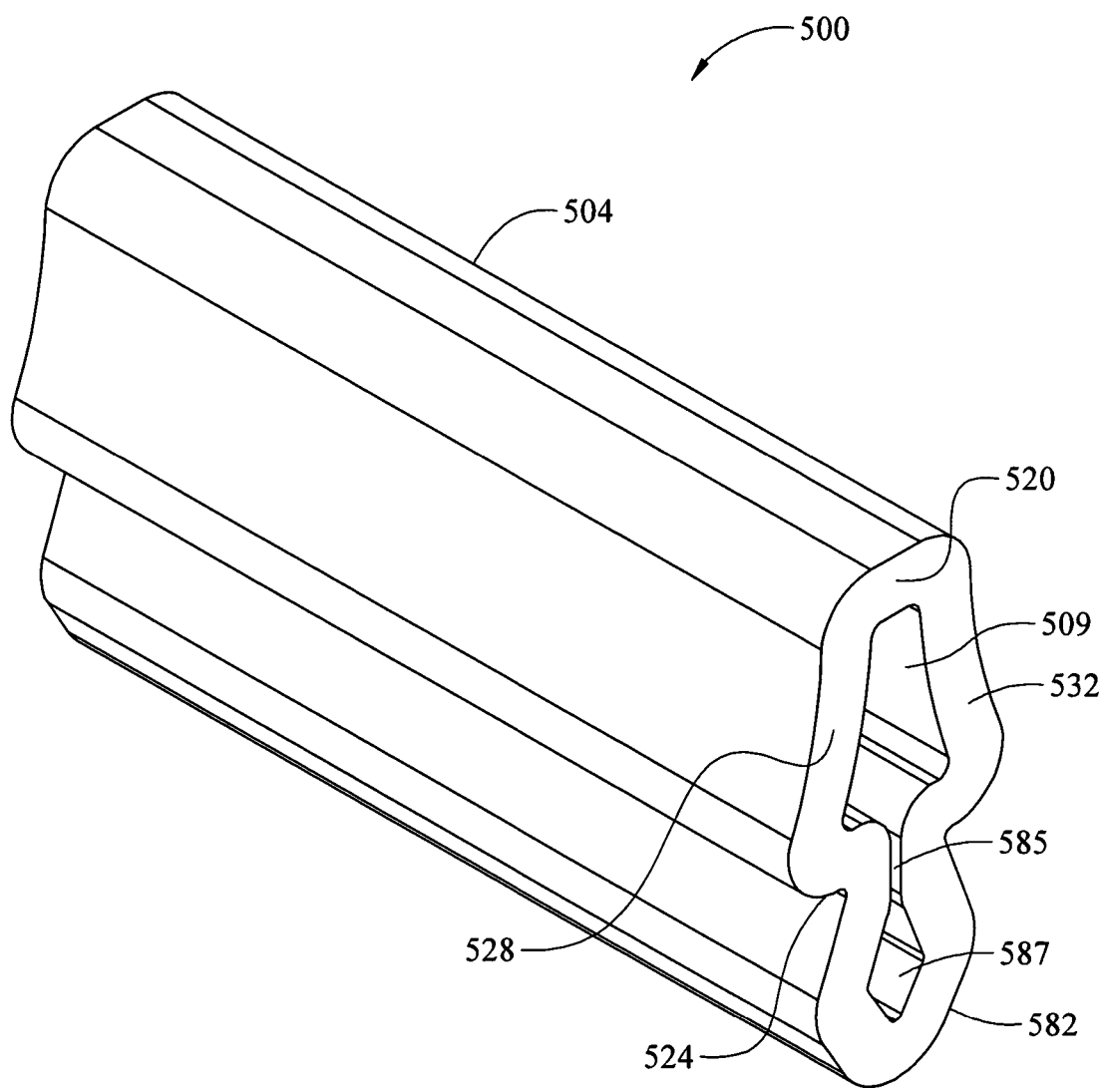
FIG. 21 is a perspective end view of another EMI shielding and/or environmental sealing gasket according to exemplary embodiments.

FIGS. 21 and 22 illustrate an alternative embodiment of a gasket 500. In this particular embodiment, the gasket 500 includes openings 509 and 587 with an opening 585 extending therebetween. The gasket 500 also includes a slot-mounting feature in the form of a bulb or portion 582 extending generally downwardly from the lower member 524. The portion 582 is configured for groove or slot mounting the gasket 500. For example, the portion 582 may be configured to be engagingly received within a groove or slot for slot mounting the gasket 500 to the surface defining the slot of groove. In some embodiments, the portion 582 may be resiliently compressible for forming an interference or friction fit with the sidewalls defining the slot or groove, such as a rectangular slot or groove, dovetail slot or groove, etc. In some embodiments, groove mounting the gasket 500 may provide for an easier and faster accurate assembly by eliminating the need for a primer and adhesive. Groove mounting may also allow for better shear resistance and easier removal for replacement.

Figure 23:
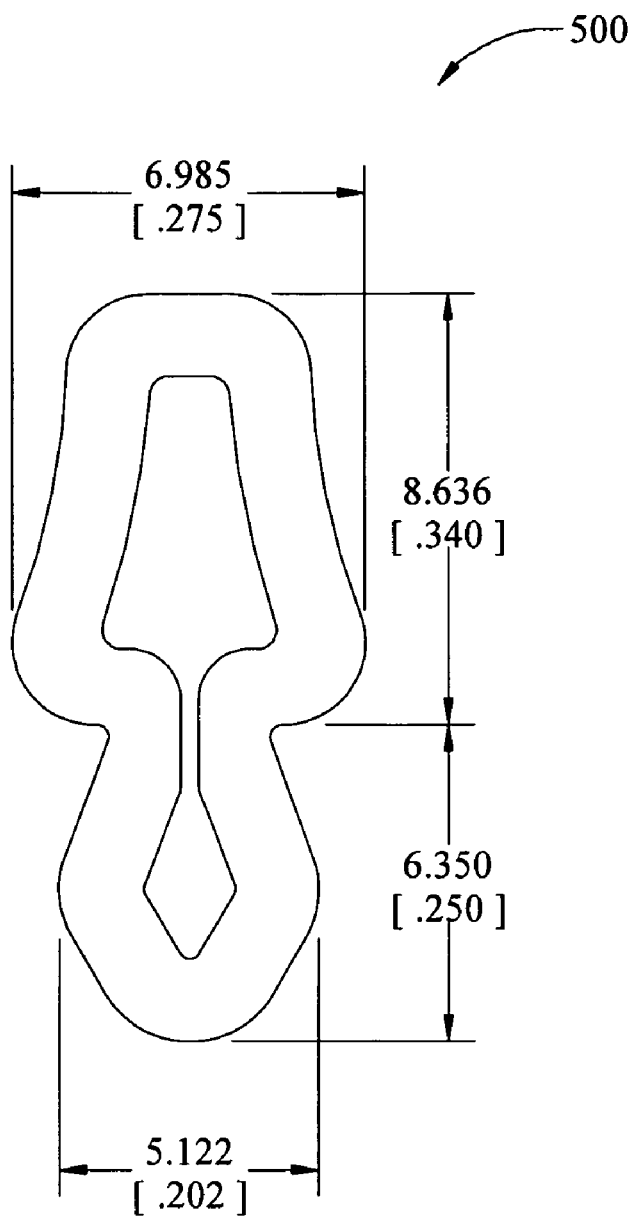
FIG. 23 is an end elevation view of the gasket profile shown in FIG. 21; with exemplary dimensional parameters provided in millimeters (inches are shown in brackets) for purposes of illustration only according to exemplary embodiments.

FIG. 23 provides exemplary dimensional parameters in millimeters (inches are shown in brackets) for the gasket 500. These dimensions are provided (as are all dimensions disclosed herein) as mere examples for purposes of illustration only. Alternative embodiments may include a differently configured portion 582 (e.g., differently shaped sized, different location, etc.). In addition, the upper portion of the gasket 500 including the upper and lower members 520, 524 and lateral members 528, 532 may be dimensionally sized and configured substantially similar to or identical to the members 220, 224, 228, 232 of gasket 200 as disclosed above and shown in FIG. 11. In other embodiments, a gasket may be configured with different dimensions and/or shaped differently depending, for example, on the particular location at which the gasket is to be used, space considerations, compression requirements, EMI shielding requirements, environmental sealing requirements, differential pressure sealing requirements, combinations thereof, etc.

The gasket's portion 582 may be integrally formed along with the gasket's body 504. For example, the body 504 and portion 582 may be integrally formed as an extrusion of elastomer material. In various embodiments, a gasket may be formed by extruding an electrically-conductive elastomer material, such as silicone or fluorosilicone rubber rendered electrically-conductive by its loading with a silver-based filler and/or a nickel-based filler. By way of example, a gasket may be formed from Electrically-Conductive Elastomer 92 (ECE92)—Fluorosilicone with Nickel/Carbon Filler. As another example, a gasket may be formed from electrically-conductive elastomer 95 (ECE95), which comprises EPDM rubber (ethylene propylene diene M-class rubber) with Nickel/Carbon filler. Alternatively, a wide range of other materials and filler particles (e.g., silver plated aluminum, tungsten carbide coated aluminum, stainless steel, aluminum oxide, and Iron Silicide (80% Iron, 20% Silicon), etc.) may also be used for any of the gaskets disclosed herein, including dielectric elastomeric materials. Likewise, other manufacturing processes besides extrusion can also be employed, such as molding, die-cutting, etc. In this regard, die-cutting may involve forming the gasket from a cured sheet of an electrically-conductive elastomer, which is cut or stamped using a die or the like into the desired configuration. Molding, in turn, may involve the compression, transfer, or injection molding of an uncured or thermoplastic elastomer into the desired configuration. The materials and manufacturing processes described herein are illustrative only, as gaskets may be formed from different materials and/or by different manufacturing processes.

With continued reference to FIGS. 21 and 22, the upper portion of the gasket body 504 has a closed generally trapezoidal cross-sectional geometry that defines a generally trapezoidal opening 509. The lower portion 582 has a closed generally diamond shaped cross-sectional geometry that defines a generally diamond-shaped opening 587. In this illustrated embodiment, there is an opening 585 extending between the openings 509 and 587. Alternatively, other embodiments may include a gasket body with an upper and/or lower portion or opening(s) with different cross sectional shapes.

Figure 20:
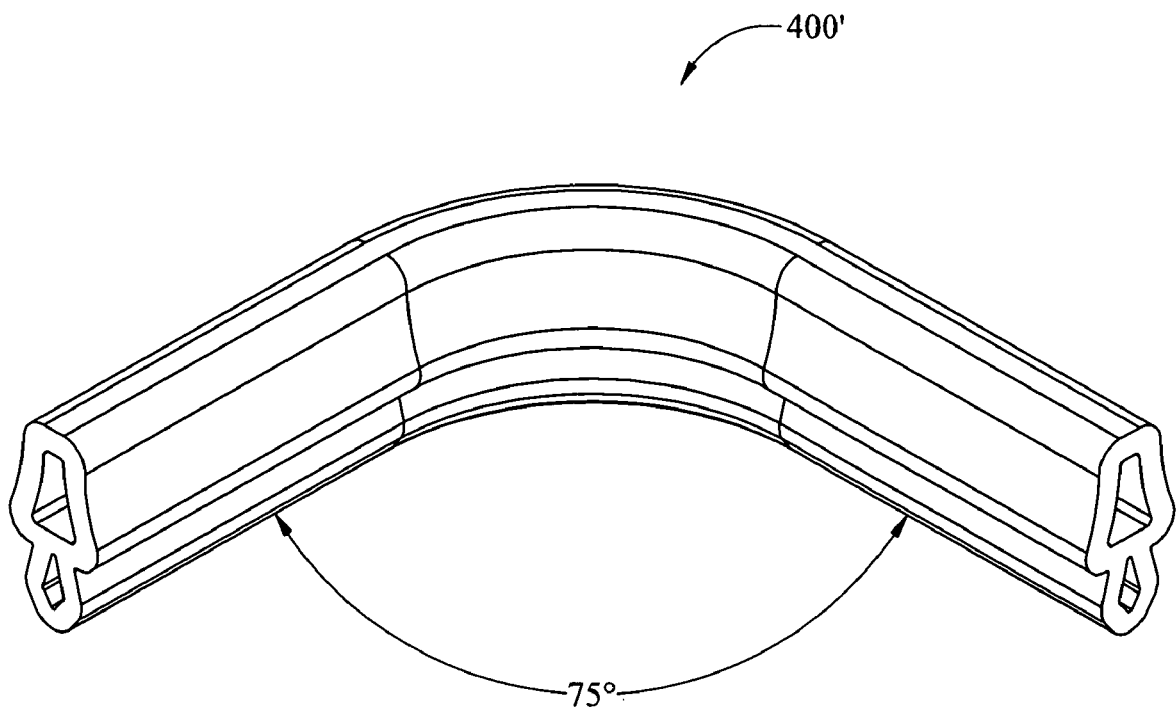
FIG. 20 is a perspective view of a seventy-five degree curved length of gasket having the profile shown in FIG. 13 according to exemplary embodiments.

With continued reference to FIG. 20, the body 504 of the gasket 500 has interior and exterior surfaces defining wall thicknesses therebetween for the gasket 500. In an exemplary embodiment of the gasket 500, the upper member 520 has a wall thickness of about 0.065 inch, the lower or base member 524 has a wall thickness of about 0.060 inch, and the portion 582 has a wall thickness of about 0.055 inch. In another example embodiment of the gasket 500, the wall thicknesses of the gasket 500 may be about 0.058 inch (with a tolerance of about +/−0.005 inch) for the wall thickness of the upper member 520, about 0.055 inch (with a tolerance of about +/−0.005 inch) for the wall thickness of the lower member 524, and about 0.058 inch (with a tolerance of about +/−0.005 inch) for the wall thickness of each lateral member 528, 532. Advantageously, some embodiments provide the upper member with a wall thickness greater than the wall thickness of the lower member in order to minimize (or at least reduce) the compressive force at the lower gap sizes (e.g., 0.134 inch gap, etc.) by delaying the abutting contact of the upper and lower inner surface portions of the first and second lateral member 528, 532 as the gasket 500 is being compressed, thus extending the deflection range over which the gasket force remains relatively constant. Alternatively, other wall thickness may be employed, and some embodiments may include a gasket having a generally uniform wall thickness completely therearound for ease of manufacturing.

The gasket's first and second lateral members 528, 532, and upper and lower members 520, 524 cooperatively define an approximately trapezoidal gasket profile. As shown in FIG. 21, the lower member 524 is wider than the upper member 520. The first and second lateral members 528 and 532 are bowed, arced, or curved slightly inwardly relative to each other.

The gasket 500 may be configured for interposition between first and second surfaces. In some preferred embodiments, the base or lower member 524 is configured such that its outer surface portions will conform to a second surface, while the outer surface of the upper member 520 is generally parallel with an upper surface. In the embodiment illustrated in FIGS. 21 and 22, the upper and lower members 520, 524 are generally parallel to each other. In addition, the outer surface portions of the lower member 524 are shown generally flat. Likewise, the outer surface of the top member 524 is also show generally flat. In other embodiments, either or both of these outer surfaces may be configured differently depending, for example, on the particular application. For example, some embodiments may have the gasket's upper and/or lower member being bowed, arced, or curved slightly inwardly.

The gasket 500 is configured such that it has generally rounded or curved corner portions or intersections. The lateral members 528, 532 extend from the upper member 520 to intersect the lower member 524. The lateral members 528, 532 convexly curve or bow generally inwardly towards each other.

In some preferred embodiments, an acute angle is defined generally between the inner surface of each lateral member 528, 532 and the inner surface of the lower member 524. Alternative embodiments, however, may include an obtuse angle or a right angle defined generally between the inner surface of each lateral member 528, 532 and the inner surface of the lower member 524. In addition, some embodiments are configured such that the angles defined generally between the inner surface of each lateral member 528, 532 and the inner surface of the base member 524 are not the same size.

In some preferred embodiments, an obtuse angle is defined generally between the inner surface of each lateral member 528, 532 and the inner surface of the upper member 520. Alternative embodiments, however, may include an obtuse angle or a right angle defined generally between the inner surface of each lateral member 528, 532 and the inner surface of the upper member 520. In addition, some embodiments are configured such that the angles defined generally between the inner surface of each lateral member 528, 532 and the inner surface of the upper member 520 are not the same size.

Figure 24:
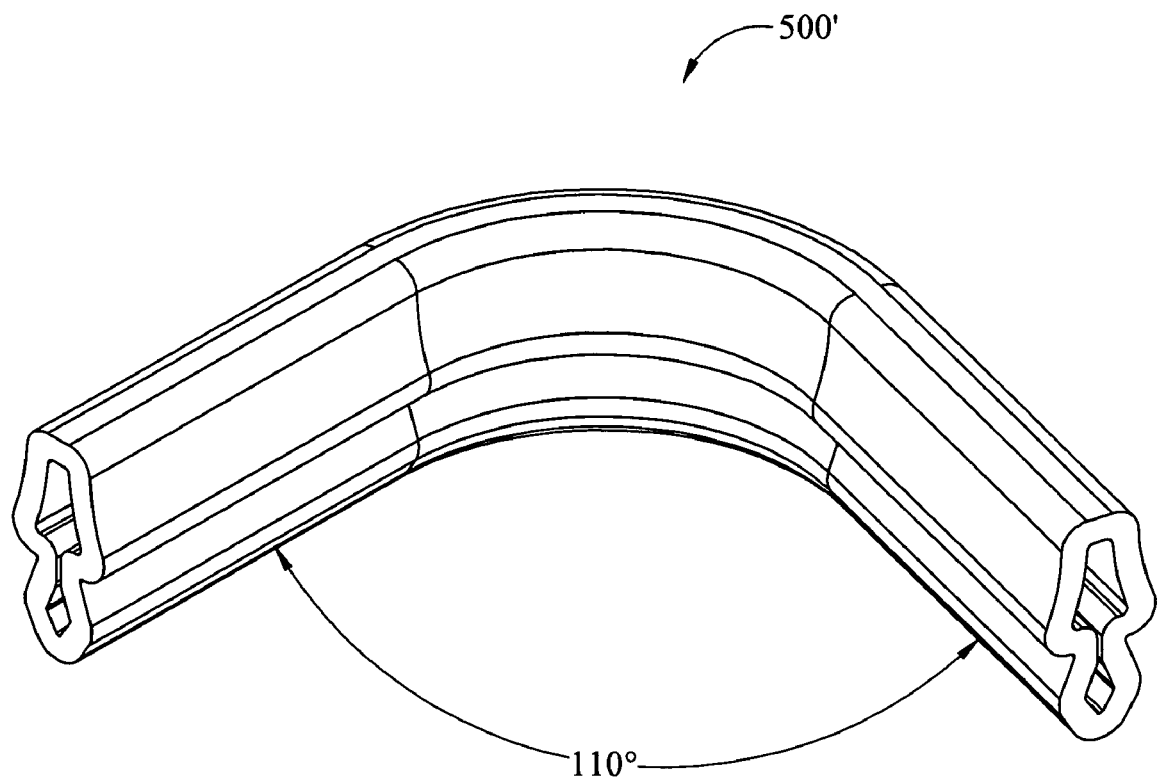
FIG. 24 is a perspective view of a one hundred ten degree curved length of gasket having the profile shown in FIG. 21 according to exemplary embodiments.

With continued reference to FIG. 21, the body 504 is shown having indefinite length. The gasket 500, however, may be cut, sectioned, or otherwise terminated for a custom fit at a particular location. In other words, the length of the gasket 500 can vary depending on the intended use of the gasket 500. The gasket 500 can be provided with a relative straight gasket length (FIG. 21), or the gasket 500 may be provided with a curved gasket length (e.g., gasket 500' in FIG. 24, etc.). Alternative embodiments include gaskets having various lengths, curvatures, etc. depending, for example, on the particular location and gap in which the gasket will be installed.

As shown in FIG. 22, the bulb or bottom portion 582 includes four members 588, 589, 590, and 591 that cooperatively define a generally diamond shaped cross-sectional geometry and a generally diamond shaped opening 587. The members 588 and 589 are connected to the lower member 524 such that an acute angle is defined generally between the outer surface of each lateral member 588 and 589 and the corresponding outer surface portion of the lower member 524. Alternative embodiments, however, may include an obtuse angle or a right angle defined generally between the outer surfaces of each lateral member 588, 589 and the corresponding outer surface portion of the lower member 524. In addition, some embodiments are configured such that the angles defined generally between the outer surfaces of each lateral member 588, 589 and the corresponding outer surface portion of the lower member 524 are not the same size.

In some preferred embodiments, an obtuse angle is defined generally between the inner surfaces of the members 588 and 590 and between the inner surfaces of the members 589 and 591. Alternative embodiments, however, may include an acute angle or a right angle instead of an obtuse angle. In addition, some embodiments are configured such that the angle defined generally between the inner surfaces of the members 588 and 590 is different than the angle defined between the inner surfaces of the members 589 and 591.

Accordingly, various embodiments disclosed herein provide gaskets having the capability to respond to a large compression range with relatively constant and sufficient force.

Such gaskets may also be minimized or at least reduced in size, thereby allowing for material cost savings and assembly fit. Some additional advantages of the gasket embodiments disclosed herein profile include a large but controlled deflection and uniform interface contact with the base substrate for more assured electrical and physical continuity and, in turn, more reliable EMI shielding and environmental sealing effectiveness. Various embodiments provide gaskets having a generally trapezoidal tubular extrusion gasket profile that are capable of sealing against EMI and air pressure differentials of at least 6.4 pounds per square inch when compressed to a gap of 0.295 inch, and at least 8.6 pounds per square inch when compressed to a gap at 0.185 inch and 0.134 inch gap. In such embodiments, the gaskets also did not exceed thirty-two pounds of gasket force per inch gasket length over the compression range, even when compressed to a gap of 0.134 inch gap. Such gaskets may also be configured such that their base members may be mounted to a surface with adhesive or other suitable attachment means. The advantages set forth in this paragraph may be realized by some embodiments, but are not requirements for all embodiments.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order or performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A gasket comprising:
    a lower member having an inner surface and an outer surface;
    an upper member having an inner surface and an outer surface;
    first and second oppositely-disposed lateral members connecting the lower member to the upper member such that when the gasket is uncompressed:
        a spaced distance separates the lower member's inner surface from the upper member's inner surface,
        the first and second lateral members have a generally convex curvature and bow inwardly relative to each other as the first and second lateral members extend from the lower member to the upper member, and the first and second lateral members, lower member, and upper member collectively define a generally trapezoidal profile.

2. The gasket of claim 1, further comprising a slot mounting feature extending generally downwardly from the lower member.

3. The gasket of claim 2, wherein the slot mounting feature is configured to be engagingly received within a slot defined by a first surface, to thereby help mount the gasket to the first surface.

4. The gasket of claim 3, wherein the engagement of the slot mounting feature and the slot allows for mounting the gasket to the first surface without adhesive.

5. The gasket of claim 3, wherein the gasket is deflectable into a collapsed orientation between the first surface defining the slot and a second surface, and wherein the lower member's outer surface is configured to conform to the first surface, with the upper member's outer surface generally parallel with the second surface.

6. The gasket of claim 1, further comprising a portion extending generally downwardly from the lower member and configured to be engagingly received within a slot defined by a first surface, to thereby help mount the gasket to the first surface.

7. The gasket of claim 6, wherein the engagement of the portion and the slot allows for mounting the gasket to the first surface without adhesive.

8. The gasket of claim 6, wherein the gasket is deflectable into a collapsed orientation between the first surface defining the slot and a second surface, and wherein the lower member's outer surface is configured to conform to the first surface, with the upper member's outer surface generally parallel with the second surface.

9. The gasket of claim 1, wherein the gasket includes:
    a portion extending generally downwardly from the lower member and having a closed generally diamond-shaped profile;
    an upper generally trapezoidal opening collectively defined by the first and second lateral members, lower member, and upper member; and
    a lower generally diamond-shaped opening defined at least partially by the portion that is also generally diamond shaped;
    the upper generally trapezoidal opening and the lower generally diamond-shaped opening are spaced apart and separated by the lower member of the gasket.

10. The gasket of claim 1, wherein the gasket includes:
    a portion extending generally downwardly from the lower member;
    an upper opening collectively defined by the first and second lateral members, lower member, and upper member;
    a lower opening defined at least partially by the portion that extends downwardly from the lower member; and
    a medial opening at least partially defined by the lower member and that extends between the upper and lower openings.

11. The gasket of claim 1, wherein the lower member's outer surface is substantially flat, and wherein the upper member's outer surface is substantially flat and generally parallel with the lower member's outer surface.

12. The gasket of claim 1, wherein the gasket includes generally rounded corner portions at about the intersections of the first and second lateral members with the lower member and upper member.

13. The gasket of claim 1, wherein the gasket is deflectable between first and second surfaces into a collapsed orientation characterized in that substantially continuous contact is maintained between the outer surface of the lower member and the second surface.

14. The gasket of claim 1, wherein the gasket is deflectable between first and second surfaces into a collapsed orientation characterized in that the first and second lateral members transition from being curved generally inwardly and bow generally outwardly away from each other as the gasket transitions into the collapsed orientation.

15. A gasket comprising:
   a lower member having an inner surface and an outer surface that is substantially flat;
   an upper member having an inner surface and an outer surface that is substantially flat and generally parallel with the lower member's outer surface;
   first and second oppositely-disposed lateral members connecting the lower member to the upper member;
   whereby when the gasket is uncompressed, the first and second lateral members, upper member, and lower member collectively define a generally trapezoidal profile with four generally rounded corner portions at about the intersections of the first and second lateral members with the lower member and upper member.

16. The gasket of claim 15, further comprising a portion extending generally downwardly from the lower member and configured to be engagingly received within a slot defined by a first surface, to thereby help mount the gasket to the first surface.

17. The gasket of claim 16, wherein the engagement of the portion and the slot allows for mounting the gasket to the first surface without adhesive.

18. The gasket of claim 15, wherein when the gasket is uncompressed, the first and second lateral members have a generally convex curvature and bow inwardly relative to each other as the first and second lateral members extend from the lower member to the upper member.

19. The gasket of claim 15, wherein the gasket includes:
   a portion extending generally downwardly from the lower member and having a closed generally diamond-shaped profile;
   an upper generally trapezoidal opening collectively defined by the first and second lateral members, lower member, and upper member; and
   a lower generally diamond-shaped opening defined at least partially by the portion that is also generally diamond shaped;
   the upper generally trapezoidal opening and the lower generally diamond-shaped opening spaced apart and separated by the lower member of the gasket.

20. The gasket of claim 15, wherein the gasket includes:
   a portion extending generally downwardly from the lower member
   an upper opening collectively defined by the first and second lateral members, lower member, and upper member;
   a lower opening defined at least partially by the portion that extends downwardly from the lower member; and
   a medial opening at least partially defined by the lower member and that extends between the upper and lower openings.

21. A gasket for interposition between first and second surfaces, the gasket comprising a resilient, tubular body of indefinite length, the tubular body having generally continuous interior and exterior surfaces defining a wall thickness therebetween, and including:
   a lower member having an inner surface forming a first portion of the interior surface of the body and an outer surface forming a first portion of the exterior surface of the body for contact with the second surface;
   an upper member narrower in width than the lower member, the upper member having an inner surface forming a second portion of the interior surface of the body, and an outer surface forming a second portion of the exterior surface of the body for contact with the first surface;
   first and second oppositely-disposed lateral members connecting the lower member to the upper member such that a spaced distance separates the lower member's inner surface from the upper member's inner surface and such that the lower member's outer surface conforms to the second surface, with the upper member's outer surface generally parallel to the first surface;
   the first and second lateral members extending from corresponding edge portions of the upper member to intersect corresponding edge portions of the lower member such that the first and second lateral members, lower member, and upper member collectively define a generally trapezoidal profile having four generally rounded corner portions at about the intersections of the first and second lateral members with the lower member and upper member;
   the first and second lateral members having a generally convex curvature and bowing inwardly relative to each other as the first and second lateral members extend from the upper member to intersect the lower member;
   the first lateral member having an outer surface forming a third portion of the exterior surface of the body, and an inner surface forming a third portion of the interior surface of the body and defining a first angle with the inner surface of the lower member and a second angle with the inner surface of the upper member;
   the second lateral member having an outer surface forming a fourth portion of the exterior surface of the body, and an inner surface forming a fourth portion of the interior surface of the body and defining a third angle with the inner surface of the lower member and a fourth angle with the inner surface of the upper member; and
   a portion extending generally downwardly from the lower member and configured to be engagingly received within a slot defined by one of the first and second surfaces, to thereby help mount the gasket to said one of the first and second surfaces.

* * * * *